(12) United States Patent
Lutze et al.

(10) Patent No.: US 8,520,448 B1
(45) Date of Patent: Aug. 27, 2013

(54) SEQUENTIAL PROGRAMMING OF SETS OF NON-VOLATILE ELEMENTS TO IMPROVE BOOST VOLTAGE CLAMPING

(71) Applicant: SanDisk Technologies Inc., Plano, TX (US)

(72) Inventors: Jeffrey W Lutze, San Jose, CA (US); Deepanshu Dutta, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/860,141

(22) Filed: Apr. 10, 2013

Related U.S. Application Data

(60) Continuation of application No. 13/360,103, filed on Jan. 27, 2012, now Pat. No. 8,451,667, which is a division of application No. 12/398,368, filed on Mar. 5, 2009, now Pat. No. 8,130,556.

(60) Provisional application No. 61/109,611, filed on Oct. 30, 2008.

(51) Int. Cl.
*G11C 7/00* (2006.01)

(52) U.S. Cl.
USPC ............... 365/189.011; 365/189.16; 365/202; 365/230.01; 365/230.04; 365/230.06; 365/233.16

(58) Field of Classification Search
USPC ............... 365/189.011, 189.16, 202, 230.01, 365/230.04, 230.06, 233.16
See application file for complete search history.

(56) References Cited

U.S. PATENT DOCUMENTS

| | | | |
|---|---|---|---|
| 4,872,142 | A | 10/1989 | Hannai |
| 5,278,785 | A | 1/1994 | Hazani |
| 5,293,350 | A | 3/1994 | Kim et al. |
| 5,544,103 | A | 8/1996 | Lambertson |
| 5,570,315 | A | 10/1996 | Tanaka et al. |
| 5,822,248 | A | 10/1998 | Satori et al. |
| 5,936,887 | A | 8/1999 | Choi et al. |
| 6,081,456 | A | 6/2000 | Dadashev |

(Continued)

FOREIGN PATENT DOCUMENTS

| | | |
|---|---|---|
| CN | 1703758 A | 11/2005 |
| CN | 101199022 A | 6/2008 |
| JP | 2002279788 A | 9/2002 |
| WO | WO2007120389 A2 | 10/2007 |

OTHER PUBLICATIONS

Restriction Requirement dated May 10, 2011, U.S. Appl. No. 12/398,368, filed Mar. 5, 2009.

(Continued)

*Primary Examiner* — Fernando Hidalgo
(74) *Attorney, Agent, or Firm* — Vierra Magen Marcus LLP

(57) ABSTRACT

A non-volatile storage system reduces program disturb in a set of non-volatile storage elements by programming using selected bit line patterns which increase the clamped boosting potential of an inhibited channel to avoid program disturb. First, second and third sets of non-volatile storage elements are programmed in separate sequences, one after another, so that all program-verify operations occur for the first set, then for the second set, and then for the third set. Each non-volatile storage element in a set is separated from the next closest non-volatile storage element in the set at least two other non-volatile storage elements in the set.

20 Claims, 17 Drawing Sheets

(56) References Cited

U.S. PATENT DOCUMENTS

| | | |
|---|---|---|
| 6,493,269 B1 | 12/2002 | Cernea |
| 6,594,180 B2 | 7/2003 | Pascucci |
| 6,795,326 B2 | 9/2004 | Chevallier |
| 6,859,397 B2 | 2/2005 | Lutze et al. |
| 6,956,770 B2 | 10/2005 | Khalid et al. |
| 7,206,235 B1 | 4/2007 | Lutze et al. |
| 7,221,587 B2 | 5/2007 | Yamashita et al. |
| 7,224,610 B1 | 5/2007 | Lambrache et al. |
| 7,269,087 B2 | 9/2007 | Hasegawa et al. |
| 7,313,023 B2 | 12/2007 | Li et al. |
| 7,336,546 B2 | 2/2008 | Chan et al. |
| 2003/0117869 A1 | 6/2003 | Hidaka |
| 2004/0051133 A1 | 3/2004 | Sugito et al. |
| 2006/0285423 A1 | 12/2006 | Scheuerlein |
| 2007/0159881 A1 | 7/2007 | Sato et al. |
| 2007/0195571 A1 | 8/2007 | Aritome |
| 2007/0263423 A1 | 11/2007 | Scheuerlein |
| 2007/0279989 A1 | 12/2007 | Aritome |
| 2008/0008002 A1 | 1/2008 | Martinelli et al. |
| 2008/0074923 A1 * | 3/2008 | Park et al. ............ 365/185.05 |
| 2008/0181020 A1 | 7/2008 | Yu et al. |
| 2008/0253193 A1 | 10/2008 | Cernea |
| 2008/0298124 A1 | 12/2008 | Wong |
| 2009/0027955 A1 | 1/2009 | Koh et al. |
| 2009/0059660 A1 | 3/2009 | Lee |
| 2009/0168538 A1 | 7/2009 | Lee |
| 2010/0110792 A1 | 5/2010 | Lutze et al. |

OTHER PUBLICATIONS

Response to Restriction Requirement dated May 25, 2011, U.S. Appl. No. 12/398,368, filed Mar. 5, 2009.

International Preliminary Report on Patentability dated May 3, 2011, International Application No. PCT/US2009/058000 filed Sep. 23, 2009.

Office Action dated Jul. 20, 2011, U.S. Appl. No. 12/398,368, filed Mar. 5, 2009.

Response to Office Action dated Oct. 20, 2011, U.S. Appl. No. 12/398,368, filed Mar. 5, 2009.

Final Office Action dated Dec. 5, 2011, U.S. Appl. No. 12/398,368, filed Mar. 5, 2009.

Response to Office Action dated Dec. 15, 2011, European Patent Application No. 09736522.5.

Response to Office Action dated Dec. 19, 2011, U.S. Appl. No. 12/398,368, filed Mar. 5, 2009.

Response to Office Action dated Jan. 6, 2012, U.S. Appl. No. 12/398,368, filed Mar. 5, 2009.

Notice of Allowance and Fee(s) Due dated Jan. 12, 2012, U.S. Appl. No. 12/398,368, filed Mar. 5, 2009.

International Search Report & The Written Opinion of the International Searching Authority dated Jan. 7, 2010, International Application No. PCT/US2009/058000 filed Sep. 23, 2009.

Lee et al., "A 64Gb 533Mb/s DDR Interface MLC NAND Flash in Sub-20nm Technology," ISSCC 2012, Session 25, IEEE International Solid-State Circuits Conference, Feb. 22, 2012, 3 pages.

Notice of Allowance dated Feb. 27, 2013, U.S. Appl. No. 13/360,103, filed Jan. 17, 2012.

English Abstract of Japanese Publication JP2002279788 published on Sep. 27, 2002.

Japanese Office Action dated May 7, 2013, Japanese Patent Application No. JP2011-534566.

Chinese Office Action dated May 6, 2013, Chinese Patent Application No. CN2009801432014.

English Abstract of Chinese Publication No. CN1703758 published Nov. 30, 2005.

English Abstract of Chinese Publication No. CN101199022 published Jun. 11, 2008.

* cited by examiner

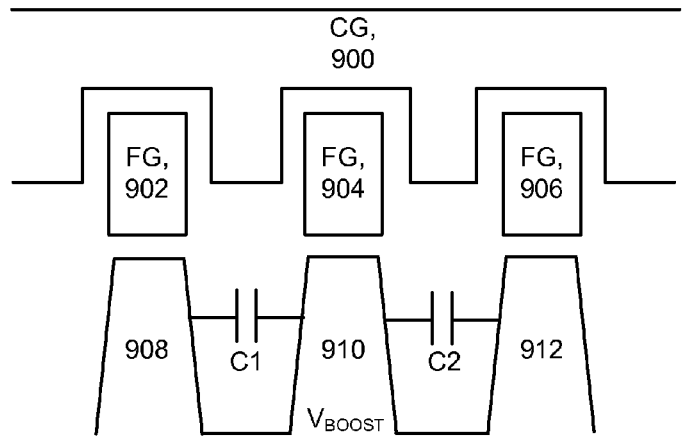
Fig. 9
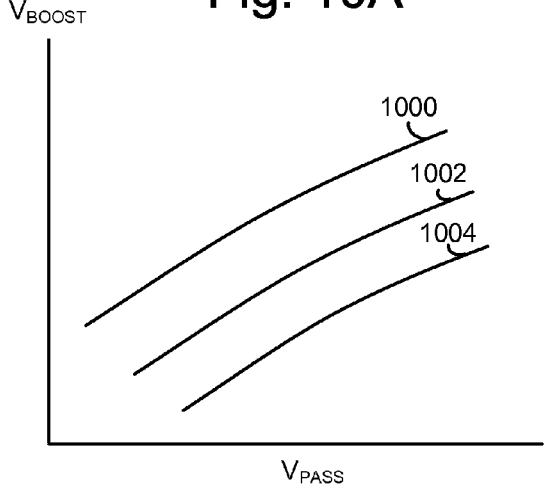
Fig. 10A
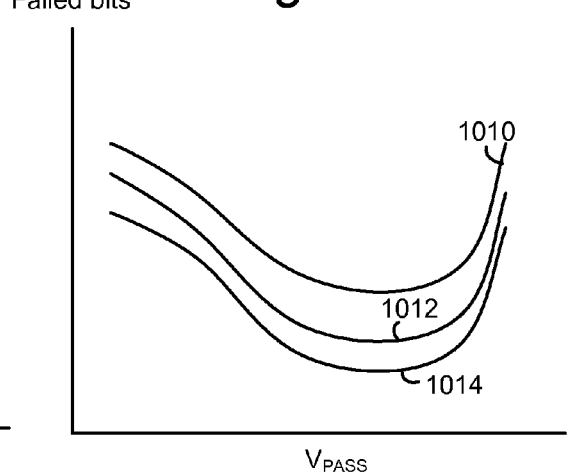
Fig. 10B
Fig. 10C
| | BL0 | BL1 | BL2 | BL3 | BL4 | BL5 | BL6 | BL7 | BL8 |
|---|---|---|---|---|---|---|---|---|---|
| A) | R | R | R | R | R | R | R | R | R |
| B) | R | R | R | E | R | R | R | E | R |
| C) | R | E | R | E | R | E | R | E | R |

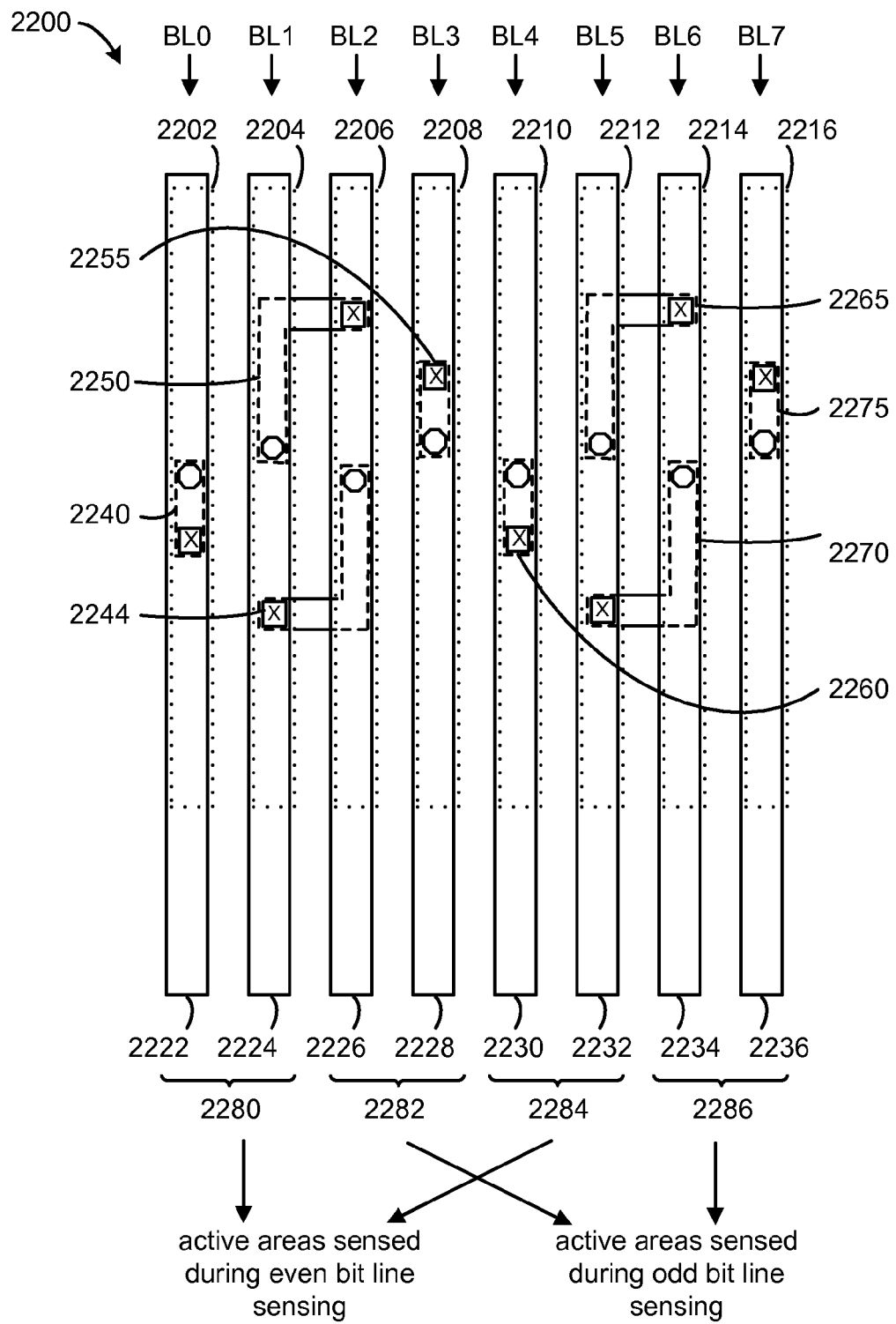

SEQUENTIAL PROGRAMMING OF SETS OF NON-VOLATILE ELEMENTS TO IMPROVE BOOST VOLTAGE CLAMPING

CROSS-REFERENCE TO RELATED APPLICATIONS

This is a continuation application of U.S. patent application Ser. No. 13/360,103, filed Jan. 27, 2012, published on May 24, 2012 as US2012/0127800and issued on May 28, 2013 as U.S. Pat. No. 8,451,667, which in turn is a divisional application of U.S. patent application Ser. No. 12/398,368, filed Mar. 5, 2009, published on May 6, 2010 as US2010/0110792 and issued on Mar. 6, 2012 as U.S. Pat. No. 8,130,556, which in turn claims the benefit of U.S. provisional patent application No. 61/109,611, filed Oct. 30, 2008, each of which is incorporated herein by reference.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Self-Boosting Technique," and in U.S. Pat. No. 6,917,542, titled "Detecting Over Programmed Memory," both of which are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

However, program disturb continues to be a problem in some memory systems. To prevent program disturb, e.g., inadvertent programming of unselected storage elements, pass voltages are typically applied to the unselected word lines to boost the voltage of the channel area of the unselected bit lines. Although this boosting technique is beneficial, the boosting voltage can become clamped or saturated at unacceptably low voltages. That is, the boosting voltage cannot be raised high enough to prevent program disturb. Improved techniques are needed to combat program disturb.

SUMMARY OF THE INVENTION

Technology is described herein for reducing program disturb in a non-volatile memory device.

In one embodiment, a method for programming a set of non-volatile storage elements includes performing multiple iterations of a programming sequence. At least one of the iterations uses a first programming procedure which includes applying a first programming pulse to the set of non-volatile storage elements while selecting a first set of pairs of adjacent non-volatile storage elements of the set for programming and inhibiting a second set of pairs of adjacent non-volatile storage elements of the set from programming, where pairs of the first set are interleaved with pairs of the second set. The first programming procedure further includes applying a second programming pulse to the set of non-volatile storage elements while selecting the second set of pairs for programming and inhibiting the first set of pairs from programming. No verify operation is performed for the set of non-volatile storage elements between the first and second programming pulses of the at least one of the iterations.

In another embodiment, a method for programming a set of non-volatile storage elements includes: (a) performing a first number of iterations of a programming sequence, where each iteration of the first number of iterations includes: (i) applying a programming pulse to the set of non-volatile storage elements while selecting a first set of pairs of adjacent non-volatile storage elements of the set for programming and inhibiting a second set of pairs of adjacent non-volatile storage elements of the set from programming, where pairs of the first set are interleaved with pairs of the second set. Each iteration of the first number of iterations further includes: (ii) subsequently performing a verify operation for the first set of pairs of adjacent non-volatile storage elements, without performing a verify operation for the second set of pairs of adjacent non-volatile storage elements. The method further includes: (b) after step (a), performing a second number of iterations of the programming sequence, where each iteration of the second number of iterations includes: (i) applying a programming pulse to the set of non-volatile storage elements while selecting the second set of pairs of adjacent non-volatile storage elements of the set for programming and inhibiting the first set of pairs of adjacent non-volatile storage elements of the set from programming, where pairs of the first set are interleaved with pairs of the second set. Each iteration of the second number of iterations further includes: (ii) subsequently performing a verify operation for the second set of pairs of adjacent non-volatile storage elements, without performing a verify operation for the first set of pairs of adjacent non-volatile storage elements.

In another embodiment, a method for programming a set of non-volatile storage elements includes performing multiple iterations of a programming sequence using a first programming procedure which includes, for each of a number of successive iterations: (a) applying a first programming pulse to the set of non-volatile storage elements while selecting a first subset of non-volatile storage elements of the set for programming and inhibiting at least second and third subsets of non-volatile storage elements of the set from programming, (b) subsequently applying a second programming pulse to the set of non-volatile storage elements while selecting the second subset for programming and inhibiting at least the first and third subsets from programming, and (c) subsequently applying a third programming pulse to the set of non-volatile storage elements while selecting the third subset for programming and inhibiting at least the first and second subsets from programming.

In another embodiment, a non-volatile storage includes a set of non-volatile storage elements and one or more control circuits. The one or more control circuits perform multiple iterations of a programming sequence. At least one of the iterations uses a first programming procedure which includes applying a first programming pulse to the set of non-volatile storage elements while selecting a first set of pairs of adjacent non-volatile storage elements of the set for programming and inhibiting a second set of pairs of adjacent non-volatile storage elements of the set from programming, where pairs of the first set are interleaved with pairs of the second set. The first programming procedure further includes applying a second programming pulse to the set of non-volatile storage elements while selecting the second set of pairs for programming and inhibiting the first set of pairs from programming. No verify operation is performed for the set of non-volatile storage elements between the first and second programming pulses of the at least one of the iterations.

In another embodiment, a non-volatile storage system includes a set of strings of series-connected non-volatile storage elements, where the strings extend parallel to one another, and a set of bit lines, where each bit line is associated with a respective one of the strings and extends over the respective one of the strings, at least in part. For a first subset of the strings, each string is electrically connected to a respective one of the conductive lines which extends over the string. For a second subset of the strings, each string is electrically connected to a respective one of the conductive lines which extends over an adjacent string.

Corresponding methods, systems and computer- or processor-readable storage devices which have executable code for performing the methods provided herein may also be provided.

BRIEF DESCRIPTION OF THE DRAWINGS

FIG. 9 is a cross section of NAND strings showing that a low voltage on neighbor NAND string of a particular NAND string can cause junction leakage and boost voltage clamping on the particular NAND string.

FIG. 10A is a graph that depicts the effect of the neighbor bit lines on the boosting potential of a particular bit line.

FIG. 10B is a graph that depicts the effect of the neighbor bit lines on the number of failed bits of a particular bit line.

FIG. 10C depicts an arrangement of data in even and odd bit lines for the graph of FIG. 10B.

FIG. 22 is an example of layout of a memory array which converts pair bit programming at the NAND string level to conventional even/odd sensing at the bit line level.

DETAILED DESCRIPTION

Figure 1:
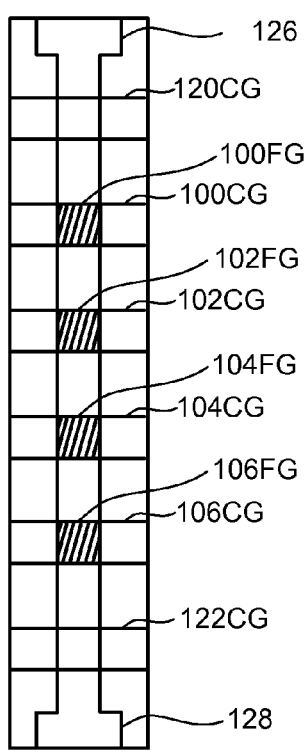
FIG. 1 is a top view of a NAND string.
Figure 2:
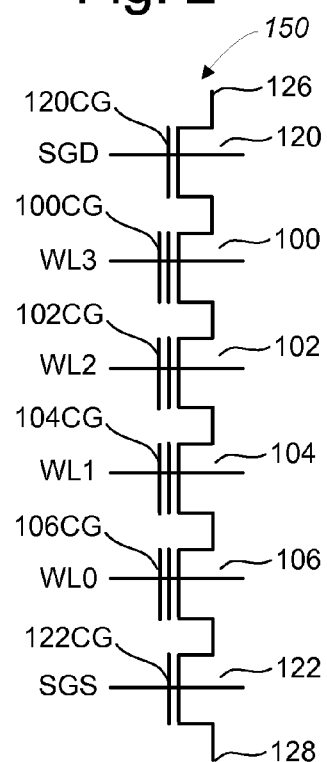
FIG. 2 is an equivalent circuit diagram of the NAND string.

One example of a memory system suitable for implementing the present invention uses the NAND flash memory structure, which arranges multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
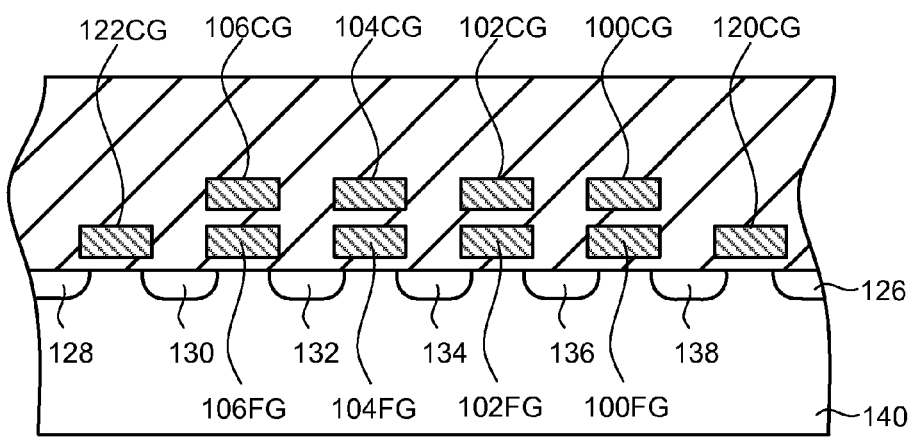
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. Pat. No. 7,237,074, "Tracking Cells For A Memory System," both of which are incorporated herein by reference in their entirety, describe various data encoding schemes for multi-state flash memory cells.

Relevant examples of NAND-type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. Pat. No. 6,522,580. Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 4:
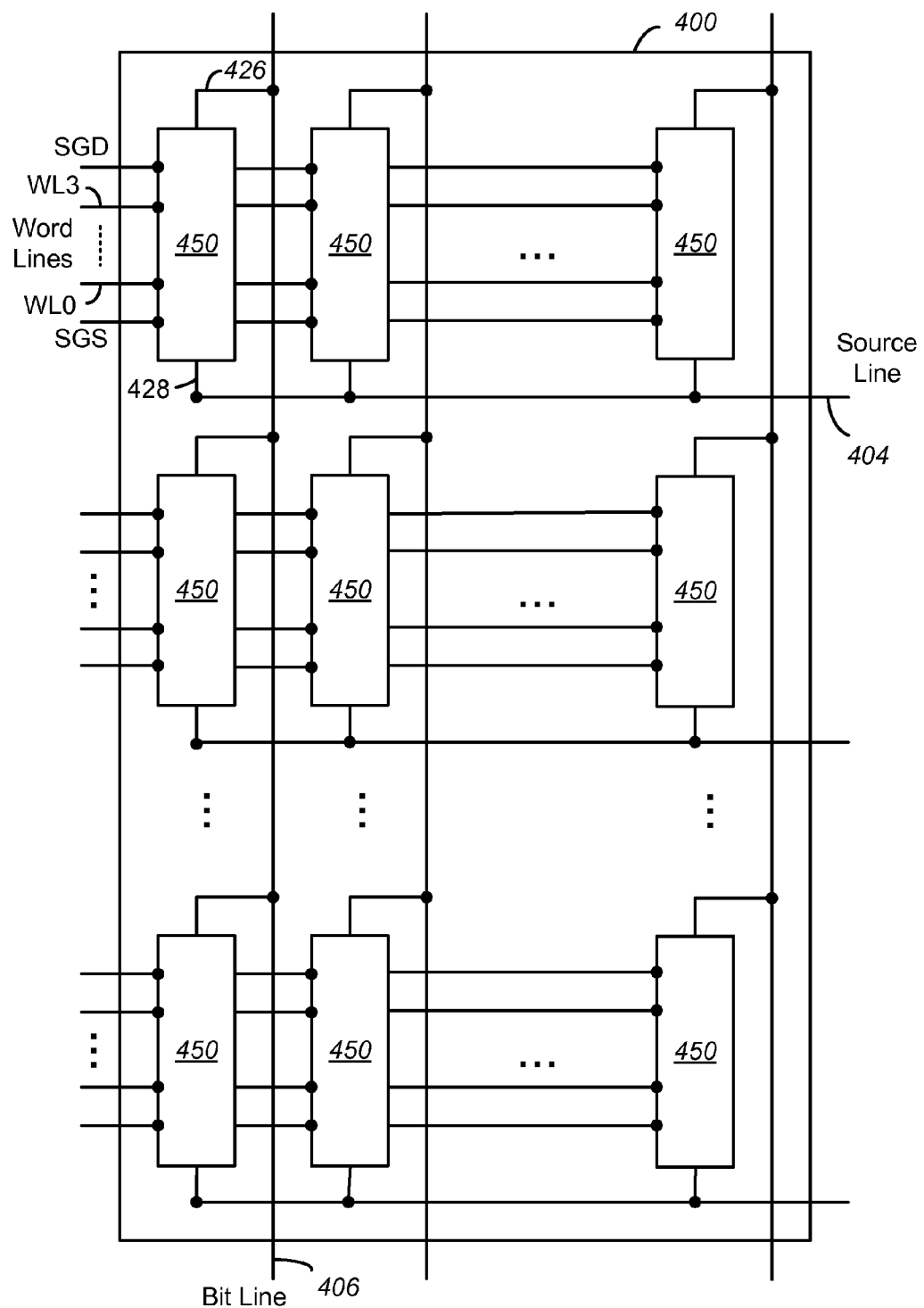
FIG. 4 is a block diagram of an array of NAND flash memory cells.

FIG. 4 illustrates an example of an array 400 of NAND cells, such as those shown in FIGS. 1-3. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
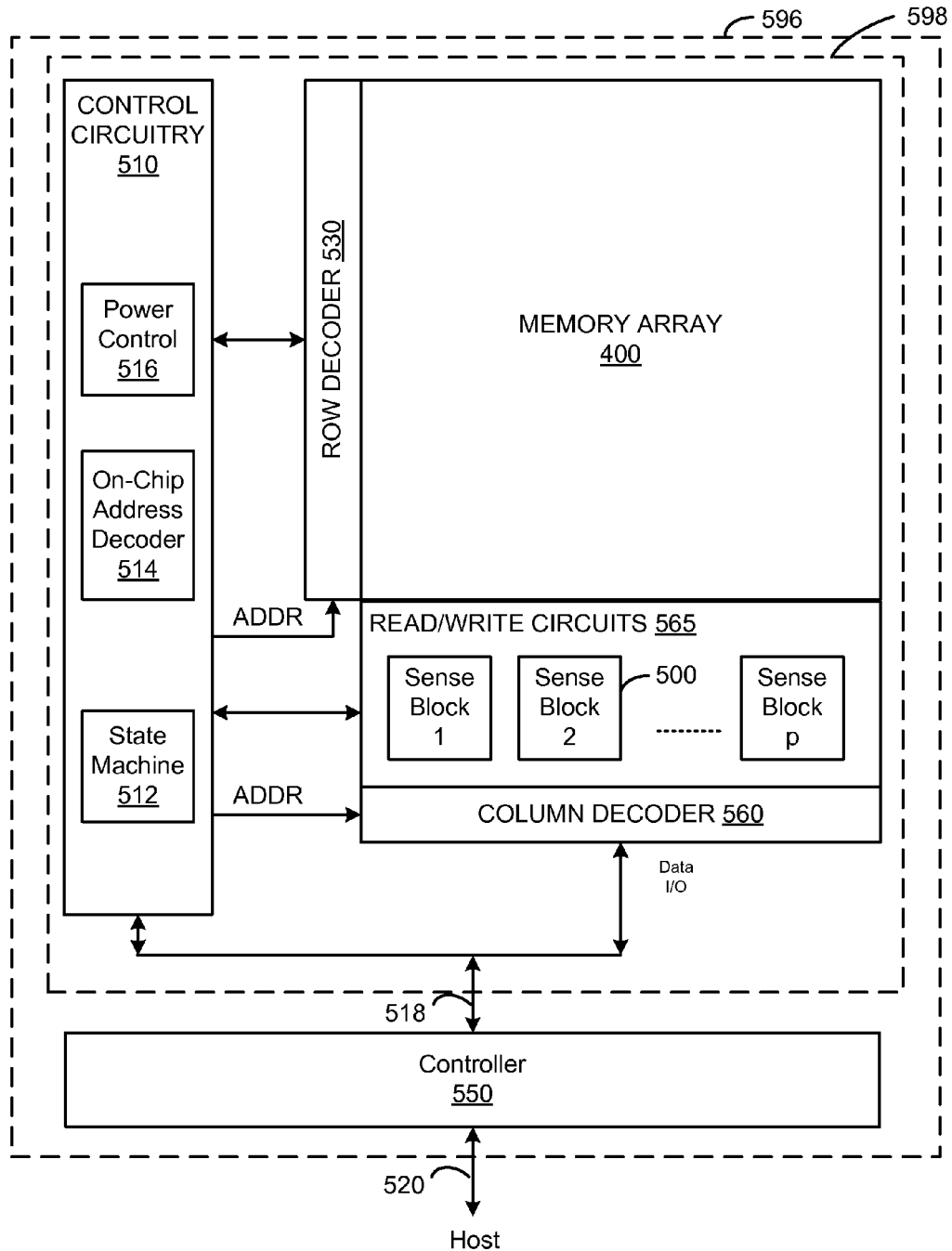
FIG. 5 is a block diagram of a non-volatile memory system.

FIG. 5 illustrates a memory device 596 having read/write circuits for reading and programming a page of memory cells in parallel, according to one embodiment of the present invention. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In another approach, dual row/column decoders and read/write circuits are used. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
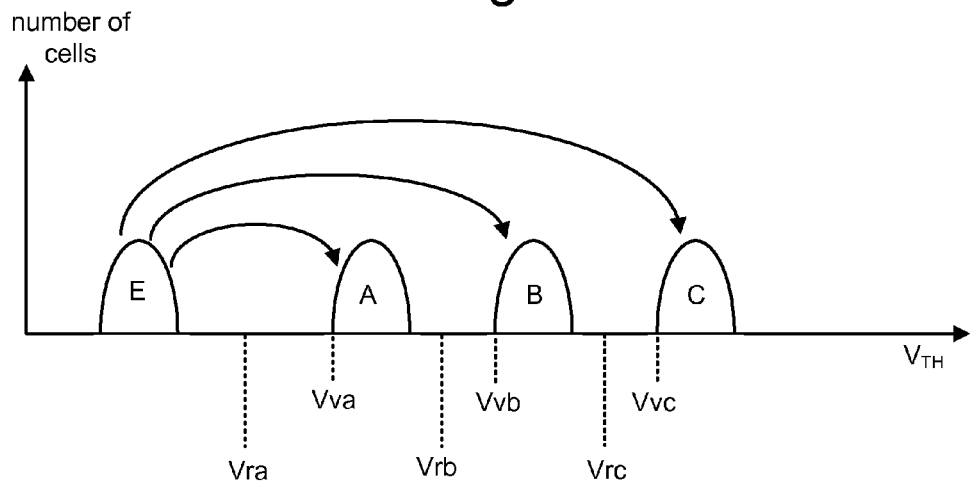
FIG. 6 depicts an example set of threshold voltage distributions.

FIG. 6 illustrates threshold voltage distributions for the memory cell array when each memory cell stores two bits of data. A first threshold voltage distribution E is for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Pat. No. 7,237,074, "Tracking Cells For A Memory System," both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 6 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. A programming process will then be used to program memory cells directly into states A, B or C. While some memory cells are being programmed from state E to state A, other memory cells are being programmed from state E to state B and/or from state E to state C. When programming from state E to state C on WLn, the amount of coupling to the adjacent floating gate under WLn−1 is a maximum since the change of voltage on the floating gate under WLn is large. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent cell on WLn.

Figure 7:
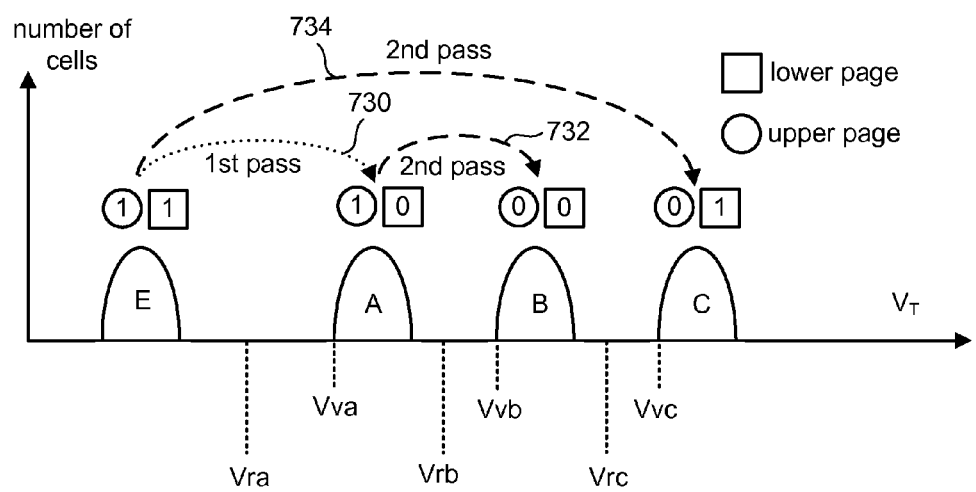
FIG. 7 depicts an example set of threshold voltage distributions.

FIG. 7 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 730. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 734. If the cell had been programmed into state A as a result of the first programming pass, then the memory cell is further programmed in the second pass so that the threshold voltage is increased to be within state B, as depicted by arrow 732. The result of the second pass is to program the cell into the state designated to store a logic "0" for the upper page without changing the data for the lower page. In both FIG. 6 and FIG. 7 the amount of coupling to the floating gate under the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Pat. No. 7,120,051, titled "Pipelined Programming of Non-Volatile Memories Using Early Data," incorporated herein by reference in its entirety.

Figure 8A:
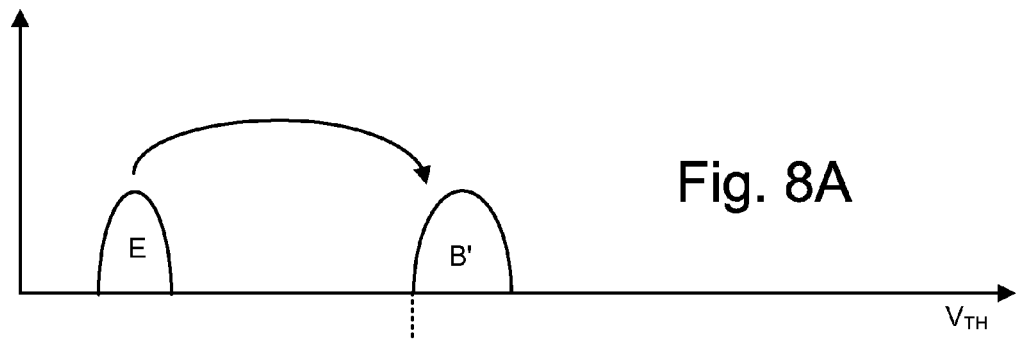
FIGS. 8A-C show various threshold voltage distributions and describe a process for programming non-volatile memory.
Figure 8B:
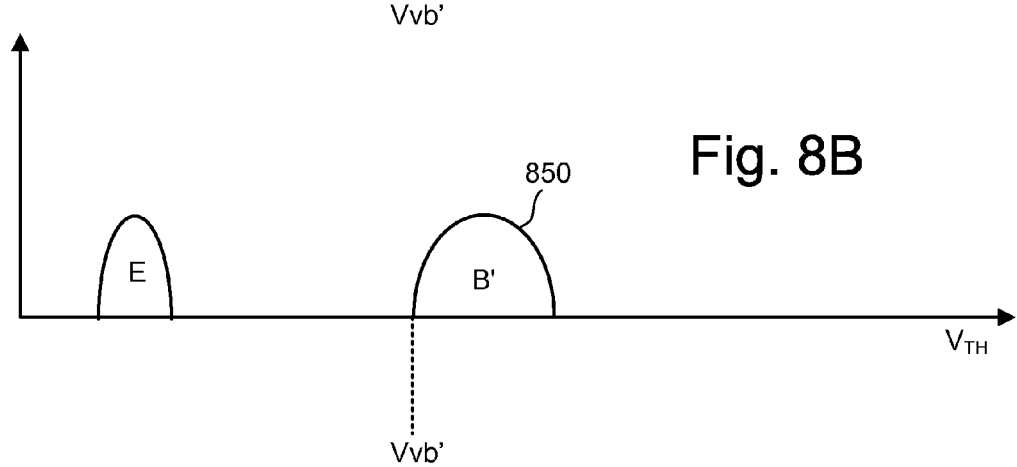
Figure 8C:
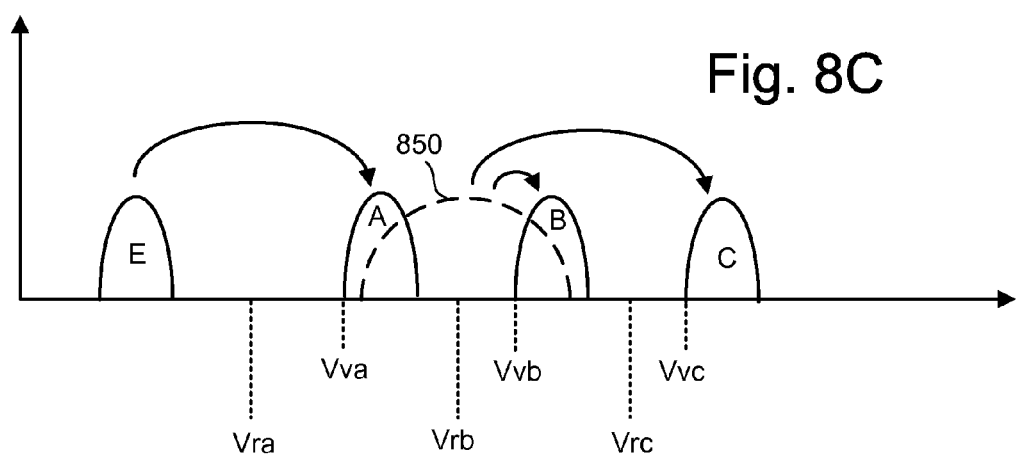

FIGS. 8A-C disclose another process for programming non-volatile memory that reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIG. 8A-C, the upper page stores bit 0 and the lower page stores bit 1. With reference to state B, the upper page stores bit 1 and the lower page stores bit 0. With reference to state C, both pages store bit data 0. The programming process of FIG. 8A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B', which may be considered to be an intermediate or foggy state. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, looking back at FIG. 2, after the lower page for memory cell 106 is programmed, the lower page for memory cell 104 would be programmed. After programming memory cell 104, the floating gate to floating gate coupling effect will raise the apparent threshold voltage of memory cell 106 if memory cell 104 had a threshold voltage raised from state E to state B'. This will have the effect of widening the threshold voltage distribution for state B' to that depicted as threshold voltage distribution 850 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 850 and the upper page data is to remain at 1, then the memory cell will be programmed to final state B. If the memory cell is in intermediate threshold voltage distribution 850 and the upper page data is to become data 0, then the threshold voltage of the memory cell will be raised so that the memory cell is in state C. The process depicted by FIGS. 8A-C reduces the effect of floating gate to floating gate coupling because only the upper page programming of neighbor memory cells will have an effect on the apparent threshold voltage of a given memory cell. An example of an alternate state coding is to move from distribution 850 to state C when the upper page data is a 1, and to move to state B when the upper page data is a 0.

Although FIGS. 8A-C provide an example with respect to four data states and two pages of data, the concepts taught by FIGS. 8A-C can be applied to other implementations with more or less than four states and different than two pages.

As mentioned at the outset, program disturb often occurs due to an inability to sufficiently boost the voltage of the channel of an unselected NAND string or other set of series-connected storage elements. In particular, as NAND technology, for instance, is scaled to ever-smaller dimensions, we have confronted a new program disturb mode known as boosting saturation or boost voltage clamping. In this fail mode, the boosting potential in a NAND string that is inhibited clamps or saturates at a relatively low level. If the pass voltage (Vpass) on the unselected word lines is increased, the boosting potential does not increase but remains flat. Thus, merely increasing the pass voltage is not effective. This is a significant issue because, if the clamped boosting potential is too low, the electric field on inhibited cells will be large when the program voltage (Vpgm) is high, causing unintended tunneling and program disturb.

The boosting potential for the clamping is dependent on the status of the neighbor NAND strings; indeed, the neighbor NAND strings are why the clamping occurs. If the neighbor NAND strings of a particular NAND string are at 0 V, as they are when the neighbor NAND strings are selected for programming, the boosting potential of the channel of the particular NAND string is clamped at a low value, but if the neighbor NAND strings are boosted, as they are when they are inhibited, and not selected for programming, the boosting potential is several Volts higher.

FIG. 9 is a cross section of NAND strings showing that low voltage on neighbor NAND strings can cause junction leakage and boost voltage clamping on the center NAND string, which is in an inhibit state. The cross section depicts a control gate (CG) or word line 900 which extends across multiple storage elements. Each storage element includes a floating gate (FG), e.g., FGs 902, 904 and 906, which is over a respective channel area 908, 910, 912 of the substrate, typically in a p-well. Each channel region is part of a NAND string which can be visualized as coming out of the page. In this example, the channel area 910 is of an inhibited string, and the channel areas 908 and 912 are of programmed strings. A capacitance C1 exists between the channel areas 908 and 910, and a capacitance C2 exists between the channel areas 910 and 912. Vboost represents a voltage potential of the channel area 910.

As mentioned, it is desirable for Vboost to be relatively high to prevent program disturb of storage elements which are associated with the channel 910. However, the neighbor NAND strings which are associated with the channels 908 and 912 can act as a "gate" for the boosted channel 910. If the neighbor NAND string channel is low (e.g., 0 V), it can cause the junction on the boosted channel to leak, limiting the boosting potential. If both neighbors are at 0 V, the situation is even worse. Note that this issue is likely to get worse with scaling, as scaling will shrink the effective gate oxide (shallow trench isolation or STI) between NAND strings, making the influence of the neighbor NAND string channels even more significant.

The effect of the neighbor bit lines on the boosting potential of a particular bit line is shown in FIG. 10A. The x-axis represents the pass voltage (Vpass) which is applied to the unselected word lines to boost the channel regions of the unselected NAND strings, and the y-axis represents Vboost, the potential of the example channel 910 of an unselected NAND string. Curve 1000 represents a situation where both neighbor channels 908 and 912 are inhibited from programming. Thus, the associated NAND strings/bit lines are not selected for programming. In this case, the channels 908 and 912 will be at a relatively high boost potential, similar to that of the channel 910. This is the most desirable situation as Vboost of the channel 910 is at the highest level.

Curve 1002 represents a situation where one neighbor channel, e.g., channel 908, is inhibited from programming, and the other neighbor channel, e.g., channel 912, is not inhibited (or vice-versa). Thus, the associated NAND string/bit line of channel 908 is not selected for programming, while the associated NAND string/bit line of channel 912 is selected for programming. This is the next most desirable situation as Vboost of the channel 910 is at a midrange level. Curve 1004 represents a situation where both neighbor channels, e.g., 908 and 912 are not inhibited. Thus, the associated NAND strings/bit lines of channels 908 and 912 are selected for programming. This is the least desirable situation as Vboost of the channel 910 is at its lowest level. The worst case clamping occurs when both neighbor bit lines are being programmed. In this case the neighbor NAND string channels are at 0 V and this voltage, acting across the Shallow Trench Isolation region (STI), causes junction leakage on the bit line that is in the inhibit state. This leads to program disturb.

FIG. 10B is a graph that depicts the effect of the neighbor bit lines on the number of failed bits of a particular bit line. The x-axis represents Vpass, and the y-axis represents a number of failed bits. FIG. 10C depicts an arrangement of data in even and odd bit lines for the graph of FIG. 10B. We programmed a block of storage elements with random data (R) on even bit lines and three different patterns on the odd bit lines. One pattern (case A) included random data on the odd bit lines, so that all bit lines had random data. A second pattern (case B) included alternating random (R) and erased (E) data on the odd bit lines, e.g., R on BL1, E on BL3, R on BL5 and E on BL7. A third pattern (case C) included erased data on all the odd bit lines. We programmed in all bit line (ABL) mode and only read the even bit line data, e.g., from BL0, BL2, BL4, BL6 and BL8. Curve 1010 represents case A, which has the highest number of failed bits, curve 1012 represents case B, which has the second highest number of failed bits, and curve 1014 represents case C, which has the lowest number of failed bits.

Case A mimics the current ABL architecture, case B mimics a pair bit programming scheme, described below, and case C mimics the best case of having both neighbor channels inhibited. The pair bit programming scheme can significantly decrease the number of fail bits (difference between curves 1010 and 1012). This demonstrates that pair bit programming scheme is an effective solution for boost voltage clamping.

In the proposed pair bit programming scheme, we program each word line using two back-to-back program pulses. For each pulse the bit lines are grouped into pairs of neighboring bit lines. On the first pulse, alternating sets of bit line pairs are programmed while the others are inhibited. On the second pulse, the program/inhibit condition is reversed for the bit line pairs. This scheme guarantees that, when a bit line is inhibited, at least one of its neighbor bit lines will also be inhibited. This eliminates the worst case scenario of an inhibited bit line with both of its neighbors programming. Always having one bit line neighbor inhibited significantly increases the clamped boosting potential. This approach increases the clamped boosting voltage without degrading other cell characteristics.

Ideally, we prefer to have the neighbors of all inhibited bit lines to also be inhibited to maximize the boosting potential, but this is impossible. However, by splitting the programming into two steps we can guarantee that at least one neighbor for every inhibited bit line will be inhibited. One possible solution is depicted in FIG. 11.

Figure 11:
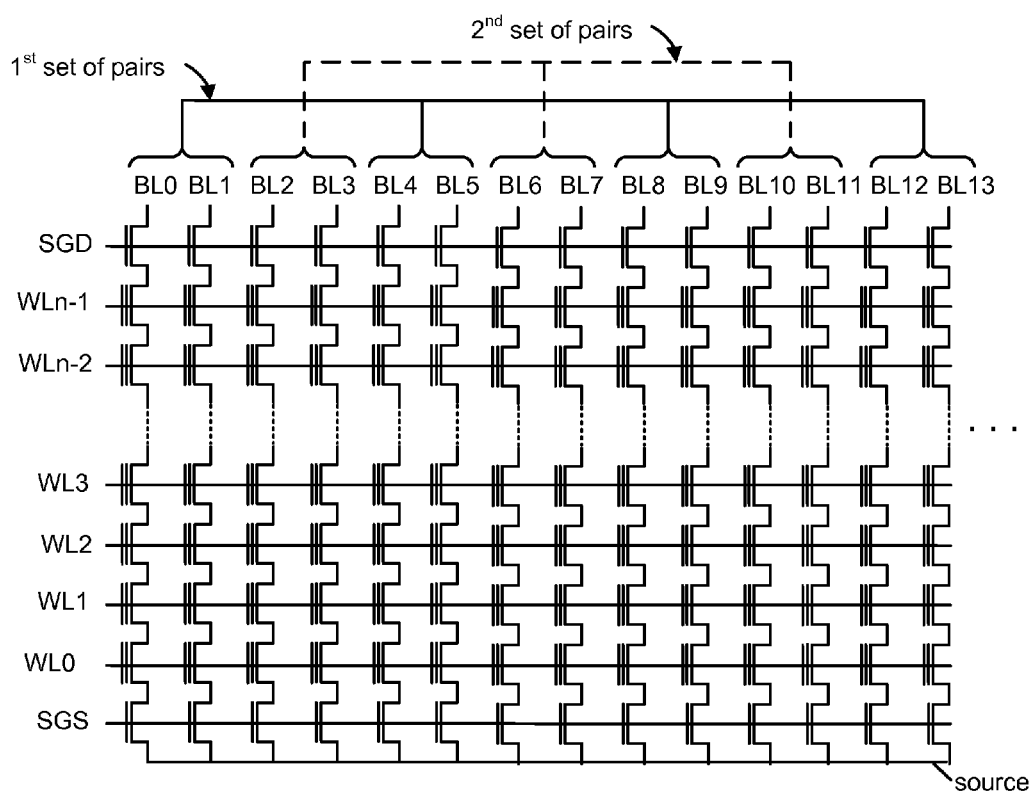
FIG. 11 depicts a set of bit lines, including first and second sets of alternating pairs of bit lines.

FIG. 11 depicts a set of bit lines, including first and second sets of alternating pairs of bit lines, in a memory array. Here, a set of bit lines and associated storage elements can be grouped into two sets. Each set has a pair of adjacent storage elements or bit lines, and the sets alternate or are interleaved with one another. For example, a first set of pairs includes the pair BL0, BL1, the pair BL4, BL5, the pair BL8, BL9, the pair BL12, BL13 and so forth. A second set of pairs includes the pair BL2, BL3, the pair BL6, BL7, the pair BL10, BL11 and so forth.

Figure 12:
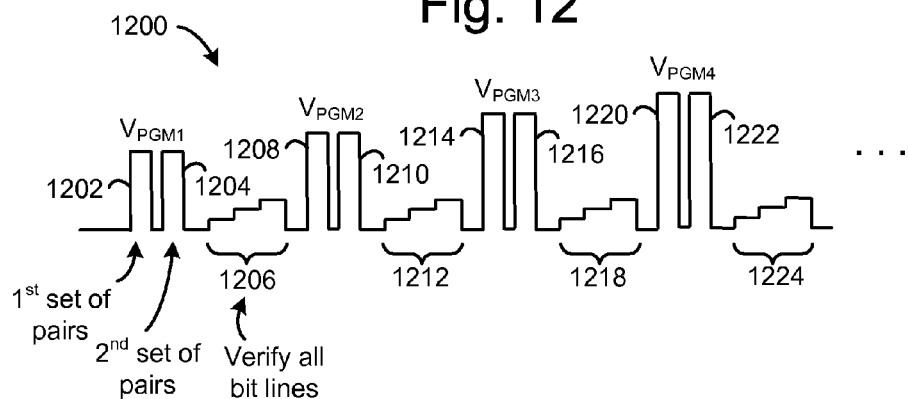
FIG. 12 depicts a programming sequence with dual programming pulses and a single set of verify pulses.

FIG. 12 depicts a programming sequence with dual programming pulses and a single set of verify pulses. An example full programming sequence is shown. Each program pulse is split into two separate pulses to program each set of bit pairs. However, the verify operation after each pulse can still be performed simultaneously for all cells on the word line using ABL sensing. Because the verify operation can still be done using ABL sensing, the performance penalty, in programming time, for using two program pulses is small. Moreover, to improve programming performance, we can restrict use of the pair bit programming scheme to pulses when Vpgm is high, since the early pulses with low Vpgm are unlikely to cause program disturb and can therefore use a single program pulse to save time. See FIGS. 21A and 21B.

In FIG. 12, the sequence 1200 includes example dual programming pulses or pulse pairs followed by a set of verify pulses for performing a verify operation. For example, dual programming pulses include 1202 and 1204 (at a level of $V_{PGM1}$), 1208 and 1210 (at a level of $V_{PGM2}$), 1214 and 1216 (at a level of $V_{PGM3}$) and 1220 and 1222 (at a level of $V_{PGM4}$). The amplitudes of the program pulses in a program pulse pair are depicted as being equal, but in practice can differ. Sets of verify pulses include sets 1206, 1212, 1218 and 1224. The levels of the pulses may be Vra, Vrb and Vrc, for instance, as discussed previously. In practice, additional program pulse pairs and verify pulses may be used. Each group of dual programming pulses and set of verify pulses forms an iteration of the programming sequence. Here, when the first program pulses 1202, 1208, 1214 and 1220 of each set of two programming pulses are applied, the first set of pairs of bit lines is selected for programming, and the second set of pairs of bit lines is not selected for programming (e.g., is inhibited from programming). Or, the second set of pairs of bit lines is selected for programming, and the first set of pairs of bit lines is not selected for programming Similarly, when the second program pulses 1204, 1210, 1216 and 1222 of each set of two programming pulses are applied, the second set of pairs of bit lines is selected for programming, and the first set of pairs of bit lines is not selected for programming. Or, the first set of pairs of bit lines is selected for programming, and the second set of pairs of bit lines is not selected for programming.

After each set of dual program pulses, a set of verify pulses 1206, 1212, 1218 and 1224, is used to perform a verify operation for all bit lines concurrently, in all bit line sensing approach. This is useful for memory devices which have this sensing capability, as it reduces overall programming time.

A bit line is selected for programming when control circuitry of the memory device indicates that a program operation is to occur for a storage element associated with the bit line. This may include setting a voltage on the bit line to a level which allows programming to occur. This level can be 0 V, for instance, or a higher, partial inhibit level which allows programming to occur more slowly than would otherwise occur with a lower voltage. A partial inhibit level can be used in the fine mode of a coarse-fine programming process in which the threshold voltage is raised at a relatively fast rate in a coarse mode and at a relative slower rate in the fine mode to avoid overshooting the target threshold verify level. Note also that a storage element which has been selected for programming is inhibited or locked out from further programming once it reaches a target verify level.

A bit line is not selected for programming, or is unselected, when the control indicates that a program operation is not to occur for a storage element associated with the bit line. This may include setting a voltage on the bit line to a high level which prohibits programming from occurring.

Figure 13:
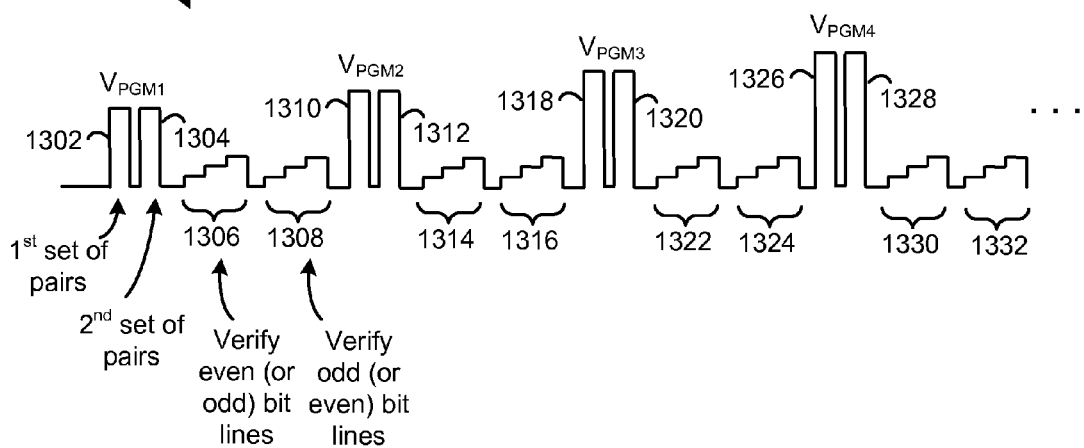
FIG. 13 depicts a programming sequence with dual programming pulses and dual sets of verify pulses for separately verifying even and odd bit lines.

FIG. 13 depicts a programming sequence with dual programming pulses and dual sets of verify pulses for separately verifying even and odd bit lines. The sequence 1300 includes example dual programming pulses or pulse pairs followed by a set of verify pulses for performing a verify operation. For example, dual programming pulses include 1302 and 1304 (at a level of $V_{PGM1}$), 1310 and 1312 (at a level of $V_{PGM2}$), 1318 and 1320 (at a level of $V_{PGM3}$) and 1326 and 1328 (at a level of $V_{PGM4}$). Sets of verify pulses include sets 1306 and 1308, 1314 and 1316, 1322 and 1324, and 1330 and 1332.

Each group of dual programming pulses and dual sets of verify pulses forms an iteration of the programming sequence. Here, when the first program pulses 1302, 1310, 1318 and 1326 of each set of two programming pulses are applied, the first set of pairs of bit lines are selected for programming, and the second set of pairs of bit lines are not selected for programming (or vice versa). Similarly, when the second program pulses 1304, 1312, 1320 and 1328 of each set of two programming pulses are applied, the second set of pairs of bit lines are selected for programming, and the first set of pairs of bit lines are not selected for programming (or vice versa).

After each set of dual program pulses, a first set of verify pulses 1306, 1314, 1322 and 1330, is used to perform a verify operation for even (or odd) numbered bit lines, e.g., BL0, BL2, BL4, and so forth. After each first set of verify pulses, a second set of verify pulses 1308, 1316, 1324 and 1332, is used to perform a verify operation for odd (or even) numbered bit lines, e.g., BL1, BL3, BL5, and so forth. This is useful for memory devices which have an odd-even sensing capability, but not an all bit line sensing capability.

Figure 14:
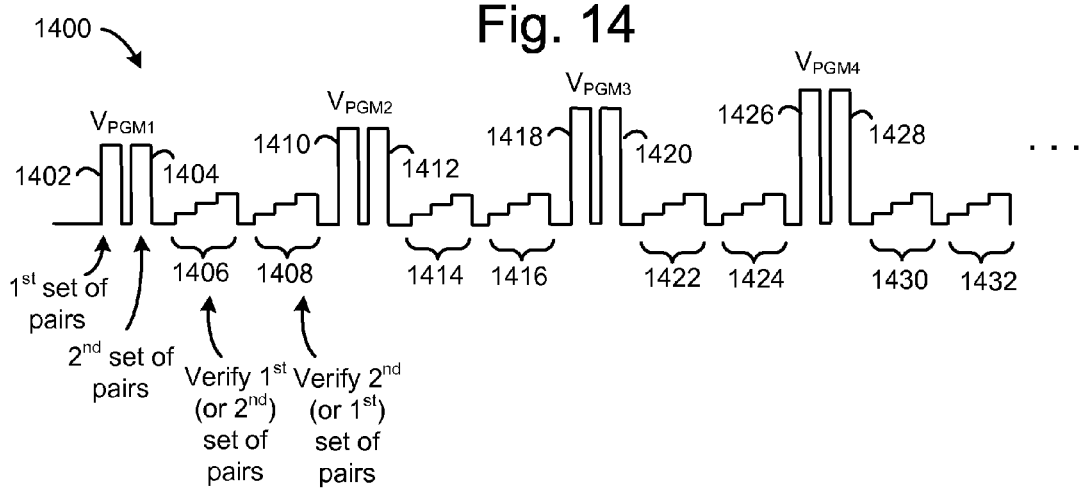
FIG. 14 depicts a programming sequence with dual programming pulses and dual sets of verify pulses for separately verifying first and second sets of pairs of bit lines.

FIG. 14 depicts a programming sequence with dual programming pulses and dual sets of verify pulses for separately verifying first and second sets of pairs of bit lines. The sequence 1400 includes example dual programming pulses or pulse pairs followed by a set of verify pulses for performing a verify operation. For example, dual programming pulses include 1402 and 1404 (at a level of $V_{PGM1}$), 1410 and 1412 (at a level of $V_{PGM2}$), 1418 and 1420 (at a level of $V_{PGM3}$) and 1426 and 1428 (at a level of $V_{PGM4}$). Sets of verify pulses include sets 1406 and 1408, 1414 and 1416, 1422 and 1424, and 1430 and 1432.

Each group of dual programming pulses and dual sets of verify pulses forms an iteration of the programming sequence. Here, when the first program pulses 1402, 1410, 1418 and 1426 of each set of two programming pulses are applied, the first set of pairs of bit lines are selected for programming, and the second set of pairs of bit lines are not selected for programming (or vice versa). Similarly, when the second program pulses 1404, 1412, 1420 and 1428 of each set of two programming pulses are applied, the second set of pairs of bit lines are selected for programming, and the first set of pairs of bit lines are not selected for programming (or vice versa).

After each set of dual program pulses, a first set of verify pulses 1406, 1414, 1422 and 1430, is used to perform a verify operation for the first (or second) sets of pairs of adjacent bit lines, e.g., the pair BL0, BL1, the pair BL4, BL5, the pair BL8, BL9, the pair BL12, BL13 and so forth. After each first set of verify pulses, a second set of verify pulses 1408, 1416, 1424 and 1432, is used to perform a verify operation for the second (or first) sets of pairs of adjacent bit lines, e.g., the pair BL2, BL3, the pair BL6, BL7, the pair BL10, BL11 and so forth. This is useful for memory devices which have an odd-even sensing capability, but not an all bit line sensing capability, when an arrangement such as FIG. 22 is used.

Figure 15:
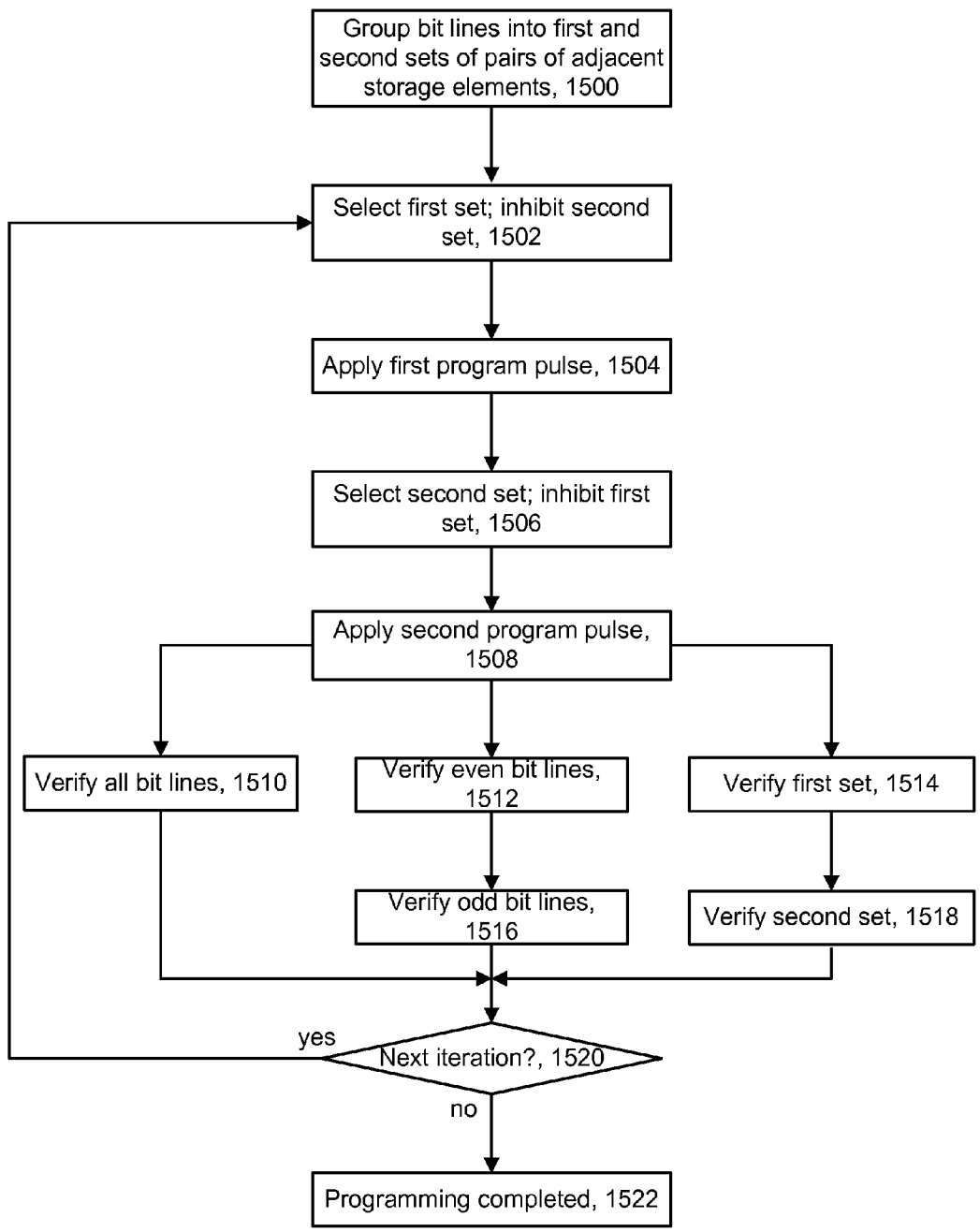
FIG. 15 depicts a programming process which is associated with the programming sequences of FIGS. 12-14.

FIG. 15 depicts a programming process which is associated with the programming sequences of FIGS. 12-14. Step 1500 includes grouping the bit lines into first and second sets of pairs of adjacent storage elements, such as depicted in FIG.

11. Appropriate control circuitry of the memory device is configured via firmware or the like to recognize this grouping. Step 1502 includes selecting the bit lines of the first set for programming, and inhibiting the bit lines of the second set from being programmed. At step 1504, a first program pulse of a pair of program pulses is applied. Step 1506 includes selecting the bit lines of the second set for programming, inhibiting the bit lines of the first set from being programmed. At step 1508, a second program pulse of the pair of program pulses is applied. No verify operation is performed between the first and second program pulses. Next, one of three possible approaches can be used, depending on the capabilities of the memory device.

In one approach, corresponding to the programming sequence of FIG. 12, all bit lines are verified concurrently (step 1510). In a second approach, corresponding to the programming sequence of FIG. 13, the even numbered bit lines are verified (step 1512), then and the odd-numbered bit lines are verified (step 1516) (or vice-versa). In a third approach, corresponding to the programming sequence of FIG. 14, the first set of pairs of adjacent storage elements is verified (step 1514), then the second set of pairs of adjacent storage elements is verified (step 1518) (or vice-versa).

At decision step 1520, if there is a next iteration of the programming sequence, the process continues at step 1502. The amplitude of the programming pulses can be incremented in each iteration, in one possible approach. Typically, a further iteration is used if some storage elements have not completed programming and a maximum allowed number of iterations has not been exceeded. If no further iterations are indicated, programming is completed (step 1522).

Figure 16:
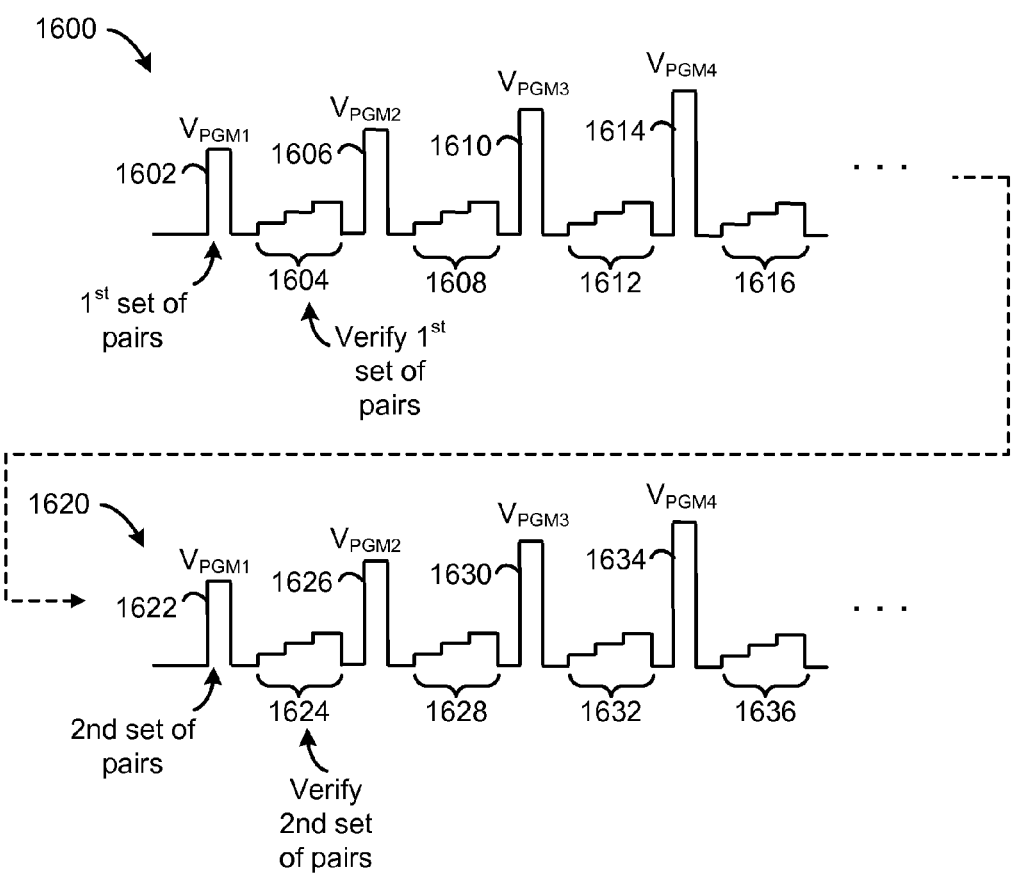
FIG. 16 depicts a programming sequence for programming a first set of pairs of bit lines followed by a programming sequence for programming a second set of pairs of bit lines.

FIG. 16 depicts a programming sequence for programming a first set of pairs of bit lines followed by a programming sequence for programming a second set of pairs of bit lines. In this approach, a first sub-sequence 1600 is performed in which a single program pulse is applied followed by a single set of verify pulses. Each group of a single programming pulse and a set of verify pulses forms an iteration of the programming sequence. Here, when the program pulses 1602, 1606, 1610 and 1614 are applied, the first set of pairs of bit lines is selected for programming, and the second set of pairs of bit lines is not selected for programming. After each program pulse, a set of verify pulses 1604, 1608, 1612 and 1616, is used to perform a verify operation for the first set of pairs of bit lines.

Once programming has been completed for the first set of pairs of bit lines in the first sub-sequence 1600, a second sub-sequence 1620 is performed in which a single program pulse 1622, 1626, 1630 and 1634 is applied followed by a single set of verify pulses 1624, 1628, 1632 and 1636. Each group of a single programming pulse and a set of verify pulses forms an iteration of the programming sequence. Here, when the program pulses 1622, 1626, 1630 and 1634 are applied, the second set of pairs of bit lines is selected for programming, and the first set of pairs of bit lines is not selected for programming (or vice-versa). After each program pulse, a set of verify pulses 1624, 1628, 1632 and 1636, is used to perform a verify operation for the second set of pairs of bit lines.

An analogous alternative approach programs the second set of pairs of bit lines followed by the first set of pairs of bit lines.

This programming sequence may be considered to include performing a first number of iterations of the first sub-sequence 1600, followed by performing a second number of iterations of the second sub-sequence 1620. Each iteration of the first number of iterations includes: (i) applying a programming pulse to a set of non-volatile storage elements while selecting a first set of pairs of adjacent non-volatile storage elements of the set for programming and inhibiting a second set of pairs of adjacent non-volatile storage elements of the set from programming, and (ii) subsequently performing a verify operation for the first set of pairs of adjacent non-volatile storage elements, without performing a verify operation for the second set of pairs of adjacent non-volatile storage elements. Each iteration of the second number of iterations includes: (i) applying a programming pulse to a set of non-volatile storage elements while selecting the second set of pairs of adjacent non-volatile storage elements for programming and inhibiting the first set of pairs of adjacent non-volatile storage elements of the set from programming, and (ii) subsequently performing a verify operation for the second set of pairs of adjacent non-volatile storage elements, without performing a verify operation for the first set of pairs of adjacent non-volatile storage elements.

Figure 17:
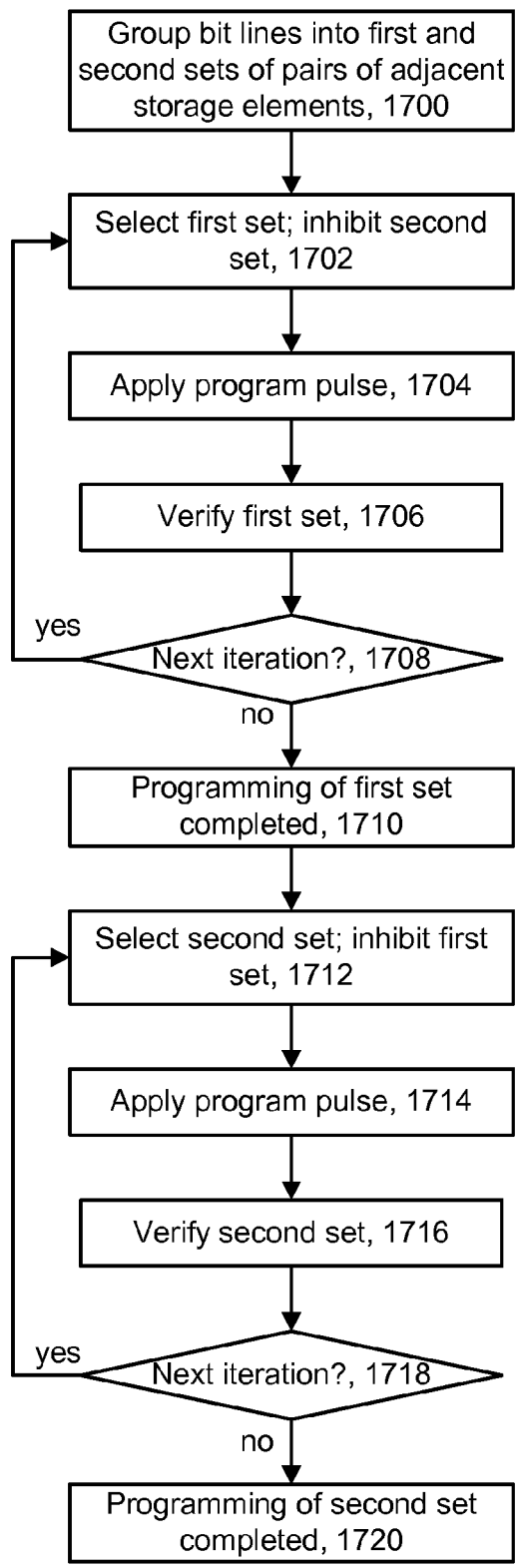
FIG. 17 depicts a programming process which is associated with the programming sequence of FIG. 16.

FIG. 17 depicts a programming process which is associated with the programming sequence of FIG. 16. Step 1700 includes grouping the bit lines into first and second sets of pairs of adjacent storage elements, such as depicted in FIG. 11. Step 1702 includes selecting the bit lines of the first set for programming, and inhibiting the bit lines of the second set from being programmed. At step 1704, a program pulse is applied. At step 1706, the bit lines of the first set are verified using a set of verify pulses. At decision step 1708, if there is a next iteration of the programming sub-sequence, the process continues at step 1702. If no further iterations are indicated, the programming of the first set is completed (step 1710), and the second programming sub-sequence begins.

Step 1712 includes selecting the bit lines of the second set for programming, and inhibiting the bit lines of the first set from being programmed. At step 1714, a program pulse is applied. At step 1716, the bit lines of the second set are verified using a set of verify pulses. At decision step 1718, if there is a next iteration of the programming sub-sequence, the process continues at step 1712. If no further iterations are indicated, the programming of the second set is completed (step 1720), and the programming process is completed.

Figure 18:
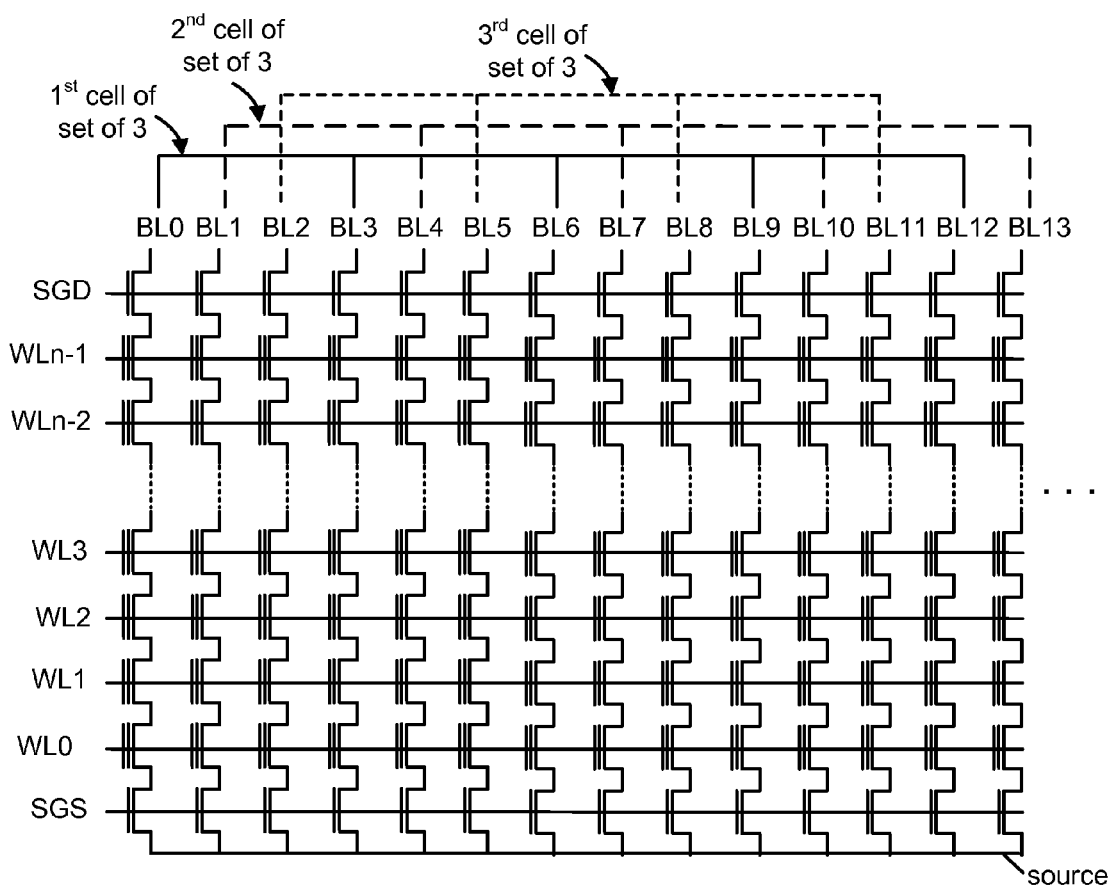
FIG. 18 depicts three sets of bit lines.

FIG. 18 depicts three sets of bit lines. Here, set of bit lines and associated storage elements can be grouped into three sets, in a one-in-three approach. Each bit line in a set is separated from the next closest bit line in the set by two other bit lines in respective sets. For example, a first set includes BL0, BL3, BL6, BL9 and BL12 and so forth, a second set includes BL1, BL4, BL7, BL10 and BL13 and so forth, and a third set includes BL2, BL5, BL8, BL11 and BL14 and so forth. It is also possible to use more than three sets but no significant further advantage is obtained in terms of boosting the channel voltage while programming time is further increased. Using three sets is sufficient to ensure that each inhibited bit line has no more than one adjacent programmed bit line.

Figure 19A:
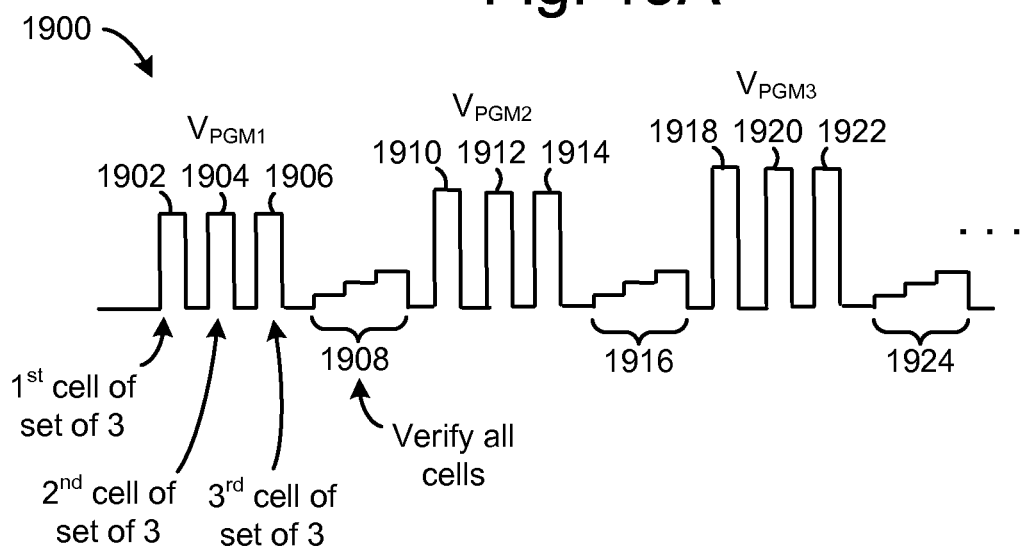
FIG. 19A depicts a programming sequence which uses three sets of bit lines.

FIG. 19A depicts a programming sequence which uses three sets of bit lines. In this approach, the bit lines are grouped into three sets, where a set includes every third bit line. For example, set 1 includes BL0, BL3, BL6, . . . , set 2 includes BL1, BL4, BL7, . . . , and set 3 includes BL2, BL5, BL8, . . . . A programming sequence 1900 is performed in which three program pulses are followed by a set of verify pulses. Each group of three programming pulses and a set of verify pulses forms an iteration of the programming sequence. Here, when the program pulses 1902, 1910 and 1918 are applied, the first set is selected for programming, and the second and third sets are not selected for programming, e.g., are inhibited from programming. When the program pulses 1904, 1912 and 1920 are applied, the second set is selected for programming, and the first and third sets are not selected for programming. Similarly, when the program pulses 1906, 1914 and 1922 are applied, the third set is selected for programming, and the first and second sets are not selected for programming. After each set of three program pulses, a set of verify pulses 1908, 1916 and 1924 is used to perform a verify operation for all of the bit lines, in an all bit line sensing approach.

Figure 19B:
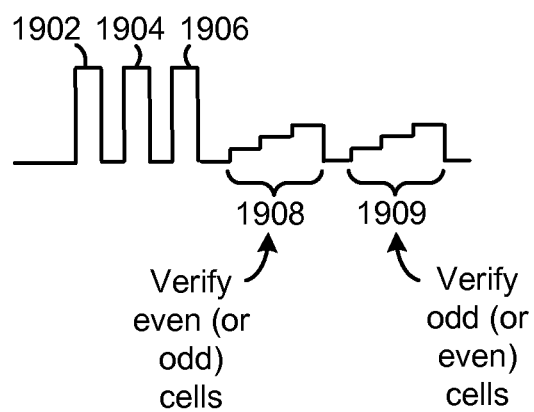
FIG. 19B depicts the programming sequence of FIG. 19A with a modification to use separate odd-even verify operations.

FIG. 19B depicts the programming sequence of FIG. 19A with a modification to use separate odd-even verify operations. Here, the set of verify pulses 1908 can be used for sensing even bit lines, while the set of verify pulses 1909 can be used for sensing odd bit lines (or vice-versa).

It is also possible to program the first, second and third sets in separate sequences, one after another, so that all program-verify operations occur for the first set, then for the second set, and then for the third set.

Figure 20:
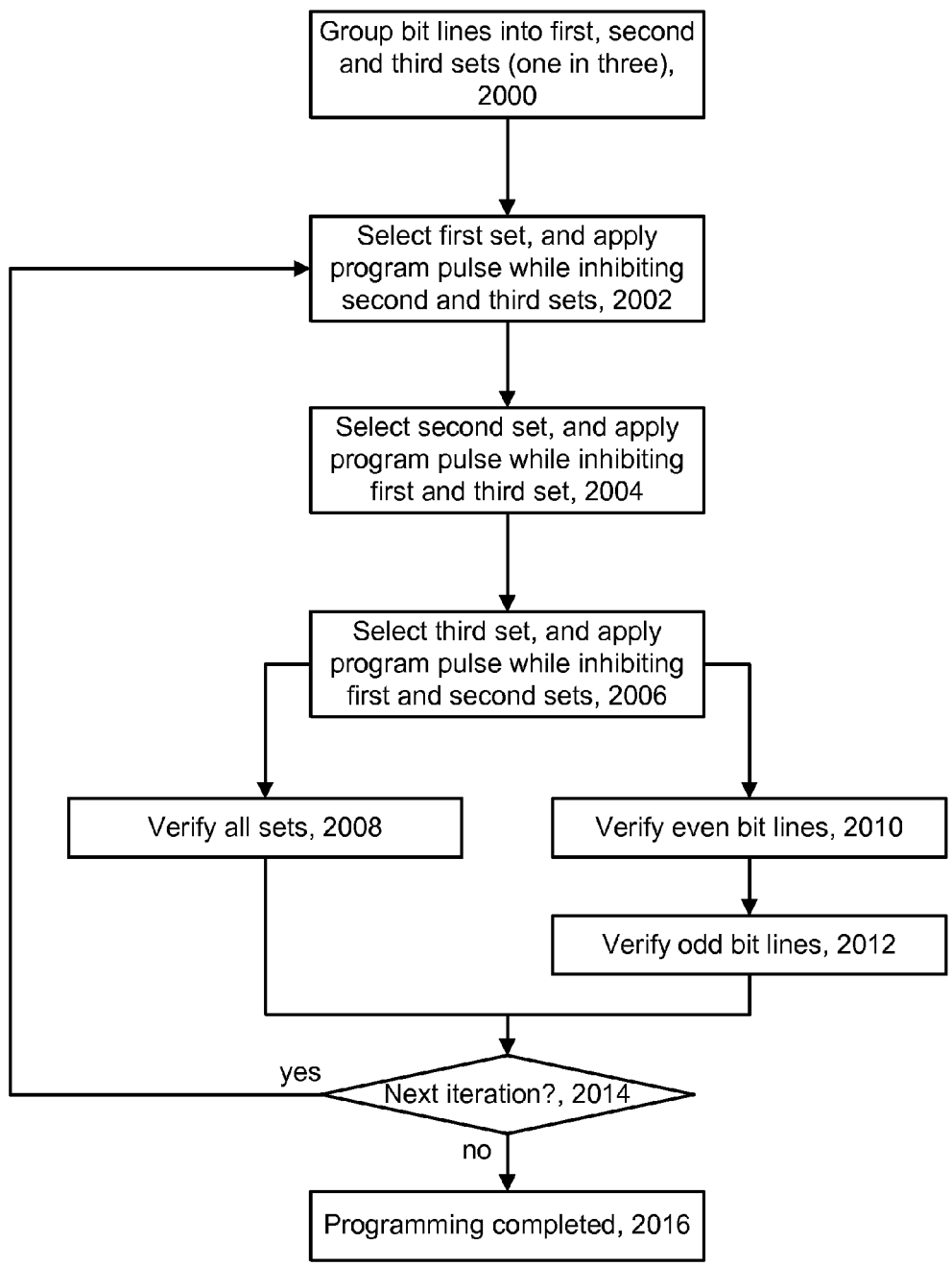
FIG. 20 depicts a programming process which is associated with the programming sequence of FIG. 19.

FIG. 20 depicts a programming process which is associated with the programming sequence of FIG. 19A. Step 2000 includes grouping the bit lines into first, second and third sets, in a one-in-three approach such as depicted in FIG. 18. Step 2002 includes selecting the bit lines of the first set for programming, and applying a program pulse to a selected word line while inhibiting the bit lines of the second and third sets from being programmed Step 2004 includes selecting the bit lines of the second set for programming, and applying a program pulse to the selected word line while inhibiting the bit lines of the first and third sets from being programmed Step 2006 includes selecting the bit lines of the third set for programming, and applying a program pulse to the selected word line while inhibiting the bit lines of the first and second sets from being programmed.

In one verify option, at step 2008, all sets of bit lines are verified concurrently, in an all bit line approach. In an even-odd verify option, at step 2010, even numbered bit lines are verified, then at step 2012, odd numbered bit lines are verified. At decision step 2014, if there is a next iteration, the process continues at step 2002. If no further iterations are indicated, the programming of the first set is completed (step 2016).

Figure 21A:
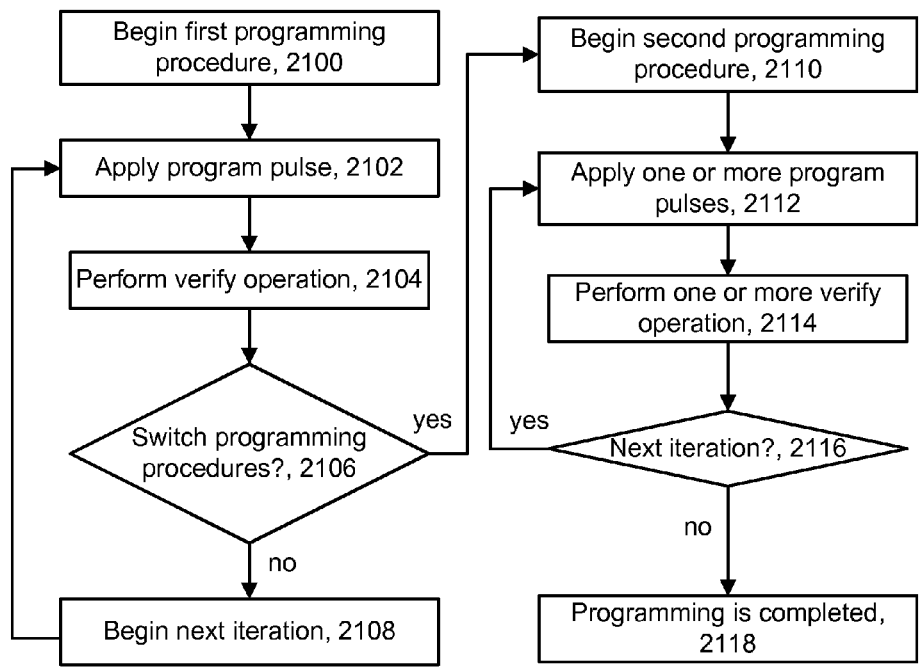
FIG. 21A depicts a programming process which involves switching programming procedures.

FIG. 21A depicts a programming process which involves switching programming procedures. It is possible to use two or more different programming procedures in an overall program sequence. For example, the programming of adjacent pairs of bit lines may be more advantageous when used with higher magnitude program pulses than with lower magnitude program pulses, in which case a switchover which is based on the program pulse magnitude, or the number of the program pulse in the program sequence, can be implemented. It is also possible to trigger a switchover based on other factors, such as temperature, number of program-erase cycles, word line position, or which page is being programmed. For instance, the switchover to programming adjacent pairs of bit lines may occur when an upper page of data is first programmed, after a lower page of data has been programmed (see FIG. 7). Or, the switchover may occur when fine mode programming first occurs after coarse mode programming has occurred. Or, the switchover may occur when a final programming pass (e.g., FIG. 8C) of a multi-pass programming technique occurs, after an earlier programming pass (e.g., FIG. 8A) occurs.

Regarding temperature, testing or simulations can indicate the number of failed bits for different switchover points and for different temperatures to yield the optimum switchover points for the different temperatures, and this information can be configured into the control of the memory device. Regarding word line position or program-erase cycles, again, testing or simulations can indicate the number of failed bits for different switchover points and for different word line positions or number of program-erase cycles to yield the optimum switchover points. Essentially, an optimization of the switchover can be implemented for any characteristic which may affect performance.

This can save programming time by using a single program pulse instead of a dual program pulses when possible. As mentioned, we can restrict use of the pair bit programming scheme to pulses when Vpgm is high, since the early pulses with low Vpgm are unlikely to cause program disturb and can therefore use a single program pulse to save time.

Figure 21B:
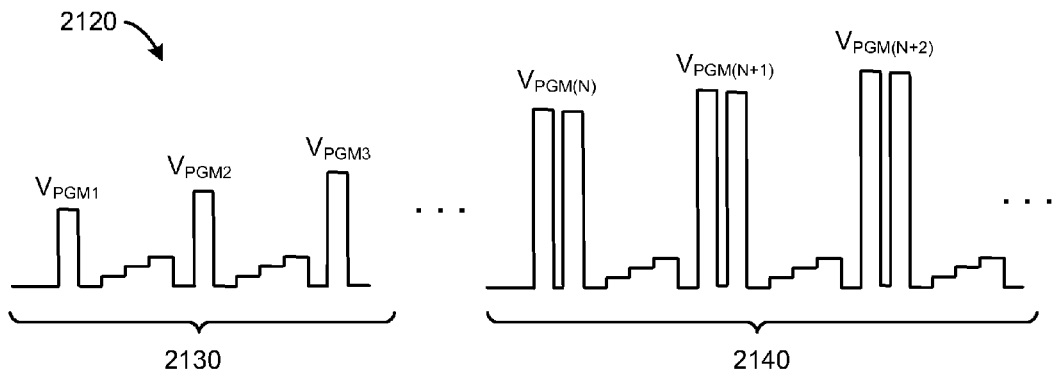
FIG. 21B depicts a programming sequence which switches programming procedures.

Refer also to FIG. 21B, which depict a programming sequence 2120 which switches programming procedures. In a first part of the sequence 2120, or a first sub-sequence 2130, a single program pulse (with amplitude $V_{PGM1}$, $V_{PGM2}$, $V_{PGM3}$, ... ) is applied followed by a set of verify pulses. In a second part of the sequence 2120, or a second sub-sequence 2140, dual program pulses (with amplitudes $V_{PGM(N)}$, $V_{PGM(N+1)}$, $V_{PGM(N+2)}$, ... ) are applied followed by a set of verify pulses. Thus, the Nth program pulse of the sequence 2120 is the first program pulse of the second sub-sequence 2140.

In FIG. 21A, step 2100 includes beginning programming using a first programming procedure. For example, this can be all bit line programming, in which all bit lines are programmed concurrently. Step 2102 includes applying a program pulse. Step 2104 includes performing a verify operation, such as by applying a set of verify pulses (or two sets of verify pulses). Decision step 2106 includes determining whether a condition for switching program procedures has been met. This can be a predetermined condition, such as a when a number N program pulses have been applied, e.g., when N program iterations have been completed.

The decision step could also include a dynamic condition, which is determined during the first programming procedure, and is adaptive to the memory device, such as a percentage of selected storage elements which have completed programming, or which have transitioned from coarse programming to fine programming. Both static and dynamic conditions can also be used. For example, switching can occur if eight program iterations have been completed and 50% of the selected storage elements have completed programmed and been locked out from further programming. In another example, switching can occur if eight program iterations have been completed and 80% of the selected storage elements have completed programmed or have transitioned to a fine programming mode.

If switching is not indicated at decision step 2106, the next iteration of the first programming procedure occurs at step 2108, and programming of the first programming procedure continues at step 2102. If switching does occur at decision step 2106, the second programming procedure begins at step 2110. For example, this may involve programming of adjacent pairs of bit lines, or one in three bit lines, in any of the variations described herein. At step 2112, one or more program pulses are applied. At step 2114, one or more verify operations are performed. Decision step 2116 determines if there is a next iteration, e.g., if there are remaining unprogrammed selected storage elements and a maximum number of iterations has not been exceeded. If there is a next iteration, processing continues at step 2112. If there is not a next iteration, programming is completed at step 2118.

FIG. 22 is an example of layout of a memory array which converts pair bit programming at the NAND string level to conventional even/odd sensing at the bit line level. Some memory devices do not have sensing circuitry which is capable of performing all bit line (ABL) sensing to sense adjacent bit lines concurrently. Instead, odd-even sensing circuitry is used which programs and verifies even numbered bit lines separately from odd numbered bit lines. With such circuitry, a grounded bit line is required on both sides of each bit line that is being read, so that the bit line discharge does not cause coupling noise. With a standard NAND layout it would be impossible to implement the pair bit line programming with conventional even/odd sensing.

A modification can be made to active region-to-bit line connections in a memory device to implement the programming techniques herein in which pairs of adjacent NAND strings are sensed concurrently while maintaining the existing non-ABL sensing circuitry which would not otherwise accommodate this functionality. In particular, we can modify the layout to effectively "flip-flop" a pair of bit lines to achieve pair bit line programming with conventional even/odd sensing. With this proposal we achieve pair bit line programming at the NAND string level, where it is important, while still maintaining the even/odd pattern at the metal bit line level, as required for conventional sensing. The modification can be made when the memory device is fabricated.

A memory array 2200 includes a number of active regions 2202, 2204, 2206, 2208, 2210, 2212, 2214 and 2216 on which the storage elements are formed. For example, this may include the p-well region 140 of FIG. 3. Each active region is part of string of series-connected non-volatile storage elements, and a set of such active regions is part of a set of such strings which extend parallel to one another. Above each active region are associated first and second metal layers, where the second metal layer is a conductive bit line. A via from an active region to a first metal layer is represent by an octagon, while a via from the first metal layer to a second, higher metal layer is represented by a square with an "X". Each bit line is associated with a respective one of the strings of storage elements and extends over the respective string, e.g., directly over, at least in part. A set of the bit lines corresponds to a set of the strings, with one bit line in communication with a respective string. A conductive path at the first metal layer can extend along a bit line and/or from one bit line to another.

For BL0, the second metal layer 2222 is connected to the associated first metal layer and active region 2202 of the same bit line through a conductive path 2240. The same is true for BL3, BL4 and BL7. Specifically, for BL3, the second metal layer 2228 is connected to the associated first metal layer and active region 2208 of the same bit line through a conductive path 2255. For BL4, the second metal layer 2230 is connected to the associated first metal layer and active region 2210 of the same bit line through a conductive path 2260. For BL7, the second metal layer 2236 is connected to the associated first metal layer and active region 2216 of the same bit line through a conductive path 2275. For the strings of storage elements associated with BL0, BL3, BL4 and BL7, which is a first subset of all strings in the array, each string is electrically connected to a respective one of the bit lines 2222, 2228, 2230 or 2236 which extends over the string.

However, for BL1, it is not connected to the active region which it is over, or which it is otherwise associated with by virtue of its relative position in a set of bit lines. Instead, BL1 is connected to the neighboring active region. Specifically, the active region 2206 is connected to the second metal layer 2224 of BL1 through a conductive path 2244, and for BL2, the active region 2204 is connected to the second metal layer 2226 of BL2 through a conductive path 2250. Similarly, for BL5, the active region 2214 is connected to the second metal layer 2232 of BL5 through a conductive path 2270, and for BL6, the active region 2212 is connected to the second metal layer 2234 of BL6 through a conductive path 2265.

Thus, a first set of adjacent pairs of bit lines (e.g., BL3, BL4; BL7, BL8 (not shown), etc.) have their metal bit lines connected to their associated active regions, and a second set of adjacent pairs of bit lines (e.g., BL1, BL2; BL5, BL6) have their metal bit lines connected to the associated active regions of adjacent neighbor bit lines. The concept can be extended to a memory array with additional bit lines. For the strings of storage elements associated with BL1, BL2, BL5 and BL6, which is a second subset of all strings in the array, each string is electrically connected to a respective one of the bit lines 2224, 2226, 2232 or 2234 which extends over an adjacent string.

As a result, when the control and sensing circuitry believe they are sensing the active area associated with BL2 via the metal layer 2226, the active area associated with BL1 will be sensed instead. Similarly, when the control and sensing circuitry believe they are sensing the active area associated with BL1 via the metal layer 2224, the active area associated with BL2 will be sensed, when the control and sensing circuitry believe they are sensing the active area associated with BL5 via the metal layer 2232, the active area associated with BL6 will be sensed, and when the control and sensing circuitry believe they are sensing the active area associated with BL6 via the metal layer 2234, the active area associated with BL5 will be sensed.

As a result, pairs of adjacent NAND strings 2280 (active areas 2202 and 2204), 2282 (active areas 2206 and 2208), 2284 (active areas 2210 and 2212) and 2286 (active areas 2214 and 2216) can be grouped, where pairs 2280 and 2284 are in a first set which is sensed concurrently using a first set of verify pulses (such as verify pulses 1406, 1414, 1422 and 1430 of FIG. 14) during even bit line sensing, and pairs 2282 and 2286 are in a second set which is sensed concurrently using a second set of verify pulses (such as verify pulses 1408, 1416, 1424 and 1432 of FIG. 14) during odd bit line sensing. Essentially, there is a reassignment of which active area is associated with which bit line.

Figure 23A:
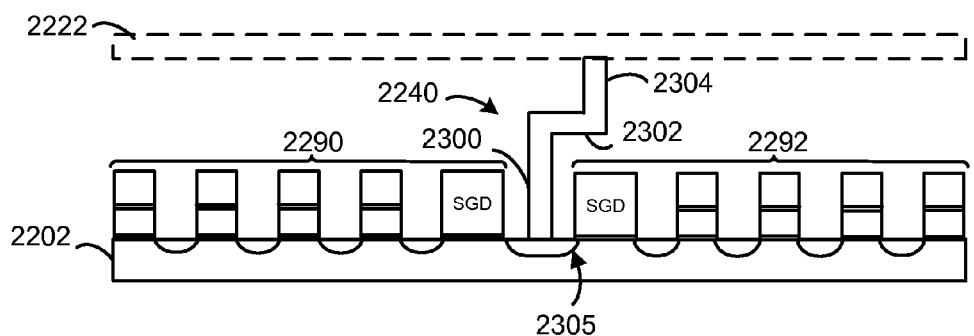
FIG. 23A depicts an active area which is connected to its associated bit line.
Figure 23B:
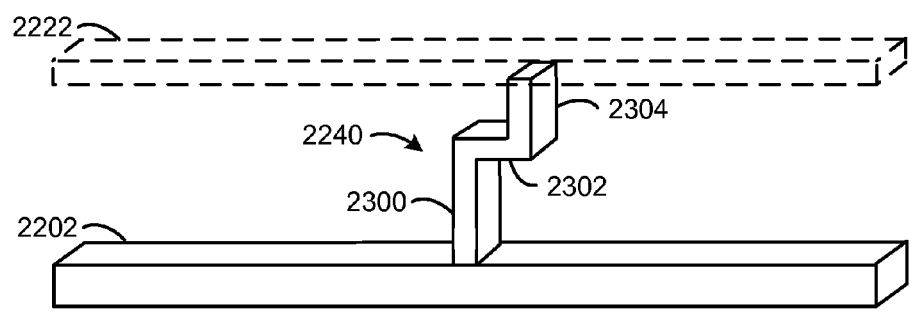
FIG. 23B depicts a perspective view of the structure of FIG. 23A.

FIG. 23A depicts an active area which is connected to its associated bit line. In particular, the active area 2202 of BL0 is depicted as including NAND string portions 2290 and 2292, each of which includes a number of storage elements and a drain side select gate (SGD). An active region 2305, such as an n-type doped region, extends between the select gates. Source/drain regions also extend between adjacent storage elements. The conductive path 2240 includes a via 2300 which extends upward from the active region 2305 to the first metal layer 2302, and a via 2304 which extends upward from the first metal layer 2302 to the second metal layer 2222 of BL0. Other layers, including filler layers, are not depicted for clarity. FIG. 23B depicts a perspective view of the structure of FIG. 23A, indicating how the second metal layer or bit line is directly over the active area/NAND string 2202. For clarity, the storage elements and select gates are not shown.

Figure 24:
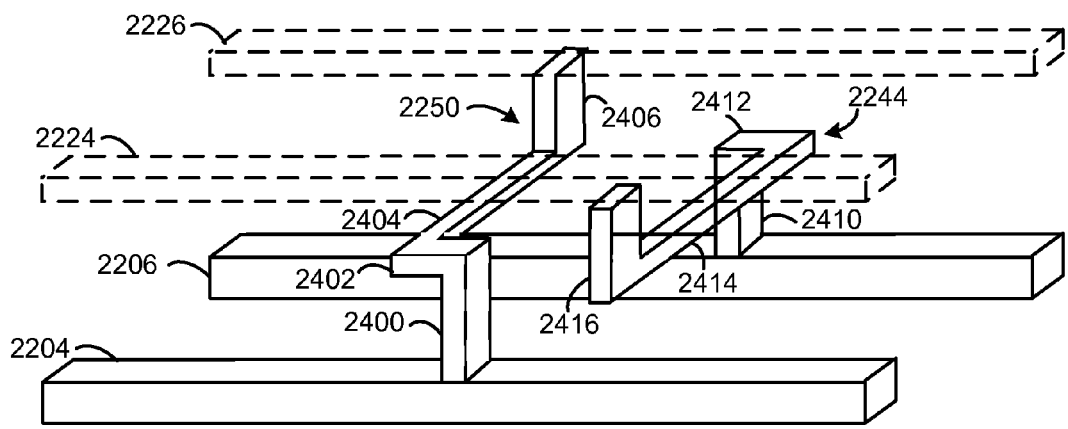
FIG. 24 depicts a perspective view of active areas which are connected to adjacent bit lines.

FIG. 24 depicts a perspective view of active areas which are connected to adjacent bit lines. Like-numbered elements correspond to one another in the figures. For clarity, the storage elements and select gates are not shown. In particular, the active area 2204 is connected via the conductive path 2250 to the metal layer 2226 of bit line BL2. The conductive path 2250 includes a via 2400 which extends upward from an active region (not shown) to a metal layer portion 2402, a metal layer portion 2404 which extends laterally toward the adjacent bit line, and a via 2406 which extends upward from the metal layer portion 2404 to the second metal layer 2226 of BL2.

Similarly, the active area 2206 is connected via the conductive path 2244 to the metal layer 2224 of bit line BL1. The conductive path 2244 includes a via 2410 which extends upward from an active region (not shown) to a metal layer portion 2412, a metal layer portion 2414 which extends laterally toward the adjacent bit line, and a via 2416 which extends upward from the metal layer portion 2414 to the second metal layer 2224 of BL1.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for programming a plurality of non-volatile storage elements on a word line, comprising:
   performing each program-verify operation of a first plurality of program-verify operations of a programming sequence by: applying a programming pulse to the word line while selecting a first set of non-volatile storage elements of the plurality of non-volatile storage elements for programming and not selecting second and third sets of non-volatile storage elements of the plurality of non-volatile storage elements for programming, and subsequently performing a verify operation for the first set without performing a verify operation for the second and third sets, each non-volatile storage element in the first set is separated from a next closest non-volatile storage element in the first set by at least two other non-volatile storage elements of the plurality of non-volatile storage elements not in the first set, each non-volatile storage element in the second set is separated from a next closest non-volatile storage element in the second set by at least two other non-volatile storage elements of the plurality of non-volatile storage elements not in the second set, and each non-volatile storage element in the third set is separated from a next closest non-volatile storage element in the third set by at least two other non-volatile storage elements of the plurality of non-volatile storage elements not in the third set, wherein the first, second and third sets of non-volatile storage elements are coupled to the word line;
   performing each program-verify operation of a second plurality of program-verify operations of the programming sequence by: applying a programming pulse to the word line while selecting the second set for programming and not selecting the first and third sets for programming, and subsequently performing a verify operation for the second set without performing a verify operation for the first and third; and
   performing each program-verify operation of a third plurality of program-verify operations of the programming sequence by: applying a programming pulse to the word line while selecting the third set for programming and not selecting the first and second sets for programming, and subsequently performing a verify operation for the third set without performing a verify operation for the first and second.

2. The method of claim 1, wherein:
   each non-volatile storage element in the first set is separated from the next closest non-volatile storage element in the first set by exactly two other non-volatile storage elements of the plurality of non-volatile storage elements, each non-volatile storage element in the second set is separated from a next closest non-volatile storage element in the second set by exactly two other non-volatile storage elements of the plurality of non-volatile storage elements, and each non-volatile storage element in the third set is separated from a next closest non-volatile storage element in the third set by exactly two other non-volatile storage elements of the plurality of non-volatile storage elements.

3. The method of claim 1, wherein:
   the non-volatile storage elements in the first set comprise one in three of the plurality of non-volatile storage elements;
   the non-volatile storage elements in the second set comprise one in three of the plurality of non-volatile storage elements;
   the non-volatile storage elements in the third set comprise one in three of the plurality of non-volatile storage elements; and
   the first, second and third sets are distinct from one another.

4. The method of claim 1, wherein:
   the selecting the first set for programming, the selecting the second set for programming and the selecting the third set for programming, comprise setting voltages of associated bit lines at a level which allows programming for non-volatile storage elements which have not completed programming.

5. The method of claim 1, wherein:
   the not selecting the second and third sets for programming, the not selecting the first and third sets for programming and the not selecting the first and second sets for programming, comprise setting voltages of associated bit lines at a level which inhibits programming.

6. The method of claim 1, wherein:
   the performing the verify operation for the first set, the performing the verify operation for the second set, and the performing the verify operation for the third set, comprise applying one or more verify pulses to the word line.

7. The method of claim 1, wherein:
   the performing the verify operation for the first set, the performing the verify operation for the second set, and the performing the verify operation for the third set, comprises applying a set of verify pulses to the word line.

8. A non-volatile storage system, comprising:
   a plurality of non-volatile storage elements;
   a word line associated with the plurality of non-volatile storage elements; and
   at least one control circuit which programs the plurality of non-volatile storage element in a programming sequence, the at least one control circuit:
   to perform each program-verify operation of a first plurality of program-verify operations of the programming sequence: applies a programming pulse to the word line while selecting a first set of non-volatile storage elements of the plurality of non-volatile storage elements for programming and not selecting second and third sets of non-volatile storage elements of the plurality of non-volatile storage elements for programming, and performs a verify operation for the first set without performing a verify operation for the second and third sets, each non-volatile storage element coupled to the word line in the first set is separated from a next closest non-volatile storage element coupled to the word line in the first set by at least two other non-volatile storage elements of the plurality of non-volatile storage elements not in the first set, each non-volatile storage element in the second set is separated from a next closest non-volatile storage element in the second set by at least two other non-volatile storage elements of the plurality of non-volatile storage elements not in the second set, and each non-volatile storage element in the third set is separated from a next closest non-volatile storage element in the third set by at least two other non-volatile storage elements of the plurality of non-volatile storage elements not in the third set, wherein the first, second and third sets of non-volatile storage elements are coupled to the word line;

to perform each program-verify operation of a second plurality of program-verify operations of the programming sequence: applies a programming pulse to the word line while selecting the second set for programming and not selecting the first and third sets for programming, and performs a verify operation for the second set without performing a verify operation for the first and third sets; and to perform each program-verify operation of a third plurality of program-verify operations of the programming sequence: applies a programming pulse to the word line while selecting the third set for programming and not selecting the first and second sets for programming, and performs a verify operation for the third set without performing a verify operation for the first and second sets.

9. The non-volatile storage system of claim 8, wherein:
each non-volatile storage element in the first set is separated from the next closest non-volatile storage element in the first set by exactly two other non-volatile storage elements of the plurality of non-volatile storage elements, each non-volatile storage element in the second set is separated from a next closest non-volatile storage element in the second set by exactly two other non-volatile storage elements of the plurality of non-volatile storage elements, and each non-volatile storage element in the third set is separated from a next closest non-volatile storage element in the third set by exactly two other non-volatile storage elements of the plurality of non-volatile storage elements.

10. The non-volatile storage system of claim 8, wherein:
the non-volatile storage elements in the first set comprise one in three of the plurality of non-volatile storage elements;
the non-volatile storage elements in the second set comprise one in three of the plurality of non-volatile storage elements;
the non-volatile storage elements in the third set comprise one in three of the plurality of non-volatile storage elements; and
the first, second and third sets are distinct from one another.

11. The non-volatile storage system of claim 8, wherein:
the selecting the first set for programming, the selecting the second set for programming and the selecting the third set for programming, comprise setting voltages of associated bit lines at a level which allows programming for non-volatile storage elements which have not completed programming; and
the not selecting the second and third sets for programming, the not selecting the first and third sets for programming and the not selecting the first and second sets for programming, comprise setting voltages of associated bit lines at a level which inhibits programming.

12. The non-volatile storage system of claim 8, wherein:
the at least one control circuit, to perform the verify operation for the first set, the verify operation for the second set, and the verify operation for the third set, applies one or more verify pulses to the word line.

13. The non-volatile storage system of claim 8, wherein:
the at least one control circuit, to perform the verify operation for the first set, the verify operation for the second set, and the verify operation for the third set, applies a set of verify pulses to the word line.

14. A method for programming a plurality of non-volatile storage elements on a word line, comprising:
performing each program-verify operation of a first plurality of program-verify operations of a programming sequence by: applying a programming pulse to the word line while selecting a first set of non-volatile storage elements of the plurality of non-volatile storage elements for programming and not selecting remaining non-volatile storage elements of the plurality of non-volatile storage elements for programming, and subsequently performing a verify operation for the first set without performing a verify operation for the remaining non-volatile storage elements;
performing each program-verify operation of a second plurality of program-verify operations of the programming sequence by: applying a programming pulse to the word line while selecting a second set of non-volatile storage elements of the plurality of non-volatile storage elements for programming and not selecting remaining non-volatile storage elements of the plurality of non-volatile storage elements for programming, and subsequently performing a verify operation for the second set without performing a verify operation for the remaining non-volatile storage elements; and
performing each program-verify operation of a third plurality of program-verify operations of the programming sequence by: applying a programming pulse to the word line while selecting a third set of non-volatile storage elements of the plurality of non-volatile storage elements for programming and not selecting remaining non-volatile storage elements of the plurality of non-volatile storage elements for programming, and subsequently performing a verify operation for the remaining non-volatile storage elements, where the non-volatile storage elements in the first set comprise one in a number N of the plurality of non-volatile storage elements, the non-volatile storage elements in the second set comprise one in the number N of the plurality of non-volatile storage elements, the non-volatile storage elements in the third set comprise one in the number N of the plurality of non-volatile storage elements, the number N is two or more, and the first, second and third sets are distinct from one another.

15. The method of claim 14, wherein:
the programming sequence is completed upon completion of the third plurality of program-verify operations.

16. The method of claim 14, wherein:
the number N is three.

17. The method of claim 14, wherein:
the selecting the first set for programming, the selecting the second set for programming and the selecting the third set for programming, comprise setting voltages of associated bit lines at a level which allows programming for non-volatile storage elements which have not completed programming.

18. The method of claim 14, wherein:
the not selecting the remaining non-volatile storage elements in the first, second and third pluralities of program-verify operations comprises setting voltages of associated bit lines at a level which inhibits programming.

19. The method of claim 14, wherein:
the performing the verify operation for the first set, the performing the verify operation for the second set, and the performing the verify operation for the third set, comprise applying one or more verify pulses to the word line.

20. The method of claim 14, wherein:
the performing the verify operation for the first set, the performing the verify operation for the second set, and the performing the verify operation for the third set, comprises applying a set of verify pulses to the word line.

* * * * *